(12) United States Patent
Aoike

(10) Patent No.: US 12,199,083 B2
(45) Date of Patent: Jan. 14, 2025

(54) RF CIRCUIT MODULE AND MANUFACTURING METHOD THEREFOR

(71) Applicant: Murata Manufacturing Co., Ltd., Kyoto-fu (JP)

(72) Inventor: Masayuki Aoike, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 18/459,248

(22) Filed: Aug. 31, 2023

(65) Prior Publication Data
US 2023/0411375 A1    Dec. 21, 2023

Related U.S. Application Data

(62) Division of application No. 17/196,965, filed on Mar. 9, 2021, now Pat. No. 11,764,197.

(30) Foreign Application Priority Data

Mar. 11, 2020  (JP) .................. 2020-041564
Dec. 15, 2020  (JP) .................. 2020-207705

(51) Int. Cl.
  *H01L 25/18*    (2023.01)
  *H01L 23/00*    (2006.01)
  *H01L 23/367*   (2006.01)
  *H01L 25/00*    (2006.01)
  (Continued)

(52) U.S. Cl.
  CPC ............ *H01L 25/18* (2013.01); *H01L 23/367* (2013.01); *H01L 24/16* (2013.01); *H01L 24/48* (2013.01); *H01L 25/50* (2013.01); *H03F 1/56* (2013.01); *H03F 3/195* (2013.01); *H01L 2224/16227* (2013.01); *H01L 2224/48145* (2013.01); *H03F 2200/222* (2013.01); *H03F 2200/387* (2013.01); *H03F 2200/451* (2013.01)

(58) Field of Classification Search
  None
  See application file for complete search history.

(56) References Cited

U.S. PATENT DOCUMENTS

| | | | |
|---|---|---|---|
| 11,121,476 B2* | 9/2021 | Kim | H01Q 1/2283 |
| 11,223,100 B2* | 1/2022 | Kim | H01Q 1/2283 |
| 2006/0290421 A1 | 12/2006 | Ichitsubo et al. | |

(Continued)

FOREIGN PATENT DOCUMENTS

| | | |
|---|---|---|
| JP | 2007-188916 A | 7/2007 |
| JP | 2016-103540 A | 6/2016 |
| JP | 2016-219682 A | 12/2016 |

*Primary Examiner* — Long Pham
(74) *Attorney, Agent, or Firm* — Studebaker & Brackett PC

(57) ABSTRACT

An RF circuit module includes a module substrate, a first substrate in which a first circuit is implemented, and a second substrate in which a second circuit is implemented. The first circuit includes a control circuit that controls an operation of the second circuit. The second circuit includes a radio-frequency amplifier circuit that amplifies an RF signal. The second substrate is mounted on the first substrate. The first substrate is disposed on the module substrate such that a circuit forming surface faces the module substrate. The first substrate and the second substrate have a circuit-to-circuit connection wire that electrically connects the first circuit and the second circuit without intervening the module substrate.

2 Claims, 25 Drawing Sheets

(51) Int. Cl.
  *H03F 1/56* (2006.01)
  *H03F 3/195* (2006.01)

(56) References Cited

U.S. PATENT DOCUMENTS

2007/0093229 A1   4/2007  Yamakawa et al.
2015/0303971 A1  10/2015  Reisner et al.
2017/0317418 A1* 11/2017  Garcia ................. H01Q 9/0407
2020/0313279 A1* 10/2020  Kim ..................... H01Q 21/08

* cited by examiner

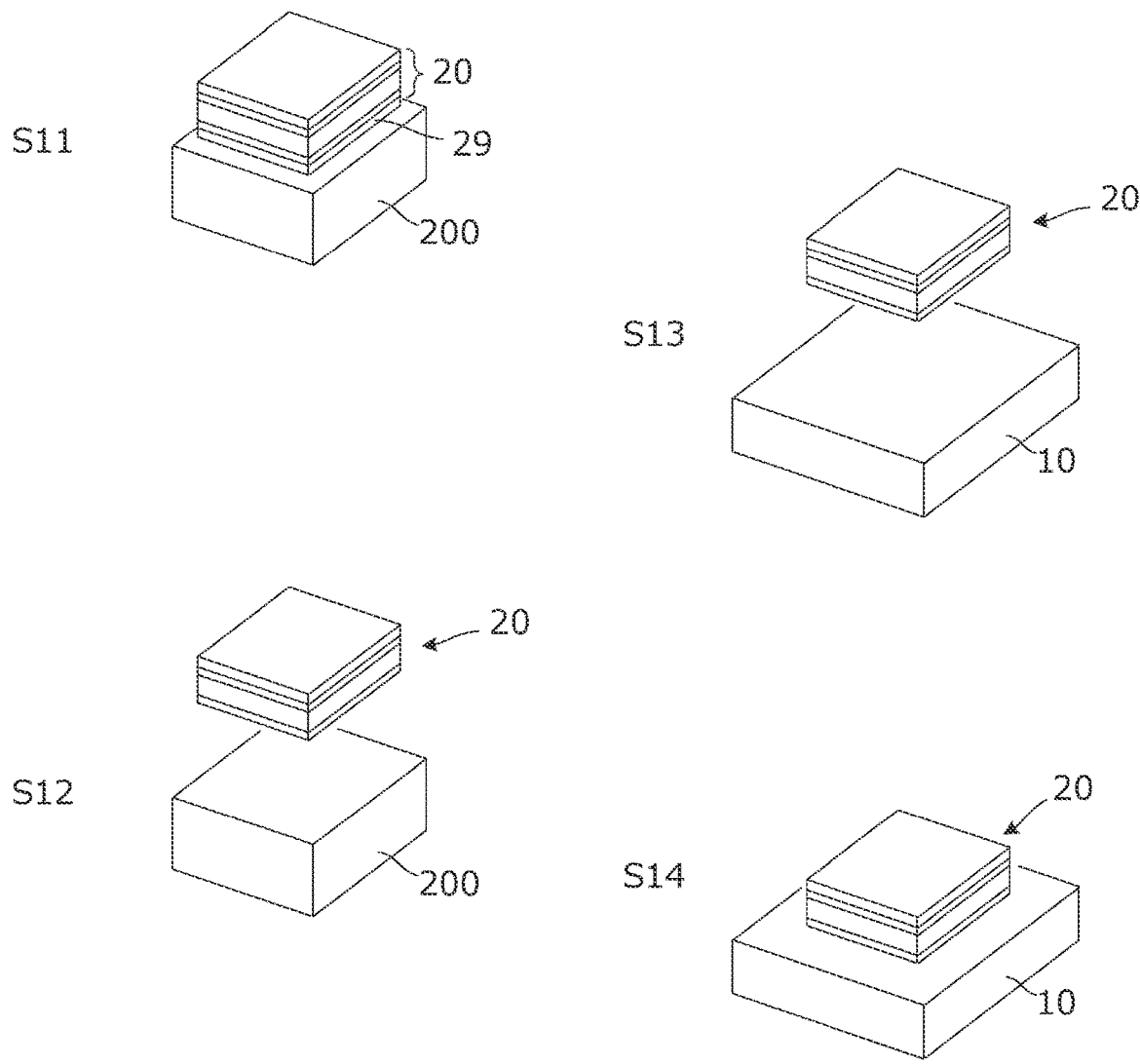

FIG. 17
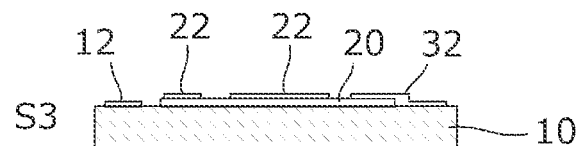

LAMINATE SUBSTRATE

RF CIRCUIT MODULE AND MANUFACTURING METHOD THEREFOR

CROSS-REFERENCE TO RELATED APPLICATIONS

This application is a Divisional of U.S. patent application Ser. No. 17/196,965, filed Mar. 9, 2021, which claims benefit of priority to Japanese Patent Application No. 2020-041564, filed Mar. 11, 2020, and to Japanese Patent Application No. 2020-207705, filed Dec. 15, 2020, the entire contents of each are incorporated herein by reference.

BACKGROUND

Technical Field

The present disclosure relates to an RF circuit module and, more specifically, to an RF circuit module having a heat generating portion and used in a circuit to handle radio-frequency power, and a manufacturing method therefor.

Background Art

Generally, in electronic devices for mobile communication, satellite communication, and the like, an RF front-end module having integrated functions of transmitting and receiving radio-frequency signals is incorporated. An RF front-end module has a module substrate on which a radio-frequency amplifier, a control IC that controls the radio-frequency amplifier, a switch IC, a duplexer, and the like are mounted. The RF front-end module is entirely sealed with resin.

For example, the radio-frequency amplifier is a monolithic microwave integrated circuit (MMIC) formed on or in a GaAs substrate, the control IC and the switch IC each are an MMIC formed on or in an Si substrate, and the radio-frequency amplifier, the control IC, and the switch IC are individually mounted on the surface of the module substrate.

On the other hand, U.S. Patent Application Publication No. 2015/0303971 describes a structure in which, to reduce the size of a module substrate, a control IC and the like are laminated on a radio-frequency amplifier and the radio-frequency amplifier, the control IC, and the like are wire bonded to electrodes on the module substrate.

FIG. 25A is a plan view of a device having a similar configuration to that of the device described in U.S. Patent Application Publication No. 2015/0303971. FIG. 25B is a cross-sectional view of the device. In this example, a hetero bipolar transistor die (HBT die) is mounted on a laminate substrate, a silicon die (Si die) is mounted on the die, and the pair of HBT die and laminate substrate, the pair of Si die and laminate substrate, and the pair of Si die and HBT die each are wire bonded.

In the structure in which a radio-frequency amplifier, a control IC, a switch IC, and the like are individually mounted on the surface of a module substrate, a footprint of these components on the module substrate is large, and wires connecting the components are long, with the result that a signal loss is also large. Since a radio-frequency amplifier is implemented on, for example, a GaAs substrate, so the heat radiation property of the radio-frequency amplifier itself is low.

With the structure described in U.S. Patent Application Publication No. 2015/0303971, the size of the module substrate is reduced as compared to the case where a radio-frequency amplifier, a control IC, and the like, of which the footprint is relatively large, are disposed side by side. However, space for wire bonding is needed, not only the effect of reducing the size of the module substrate is small but also a loss tends to increase particularly in a radio frequency range or an impedance mismatching of a line tends to occur under the influence of parasitic inductance or the like that occurs in wires. In addition, the effect of radiating heat generated from a radio-frequency amplifier is low.

On the other hand, with a request for higher speed and higher output power of radio-frequency amplifiers in recent years, a characteristic limit due to their self heat generation has become a challenge. For example, a bipolar transistor exhibits thermal runaway in such a positive feedback that the bipolar transistor generates heat due to its collector loss, a saturation voltage Vbe between the base and the emitter decreases as a result of an increase in the temperature of the bipolar transistor, a collector current increases as a result, and Vbe further decreases. For this reason, an electric power that can be handled in a controllable range is limited.

Therefore, size reduction of an RF circuit module is impossible unless heat of a radio-frequency amplifier is radiated with high efficiency in a state where the RF circuit module is implemented.

SUMMARY

Accordingly, the present disclosure provides an RF circuit module reduced in size without constraints to heat radiation property or an RF circuit module having a high heat radiation property with a small size, and a manufacturing method for the RF circuit module. Also, the present disclosure provides an RF circuit module that suppresses the degradation of a circuit in electrical characteristics due to wires with excellent radio-frequency performance, and a manufacturing method for the RF circuit module.

(1) According to preferred embodiments of the present disclosure, an RF circuit module includes a module substrate having electrodes for mounting components; a first substrate in which a first circuit is implemented; and a second substrate in which a second circuit is implemented. The first circuit includes a control circuit that controls an operation of the second circuit. The second circuit includes a radio-frequency amplifier circuit that amplifies an RF signal. The second substrate is mounted on the first substrate. The first substrate is flip-chip bonded to the module substrate. The first substrate and the second substrate have a conductor layer that makes up a circuit-to-circuit connection wire that electrically connects the first circuit and the second circuit without intervening the module substrate. The first substrate has a first substrate-side conductor protrusion connected to one of the electrodes of the module substrate. The second substrate has a second substrate-side conductor protrusion connected to another one of the electrodes of the module substrate.

(2) According to preferred embodiments of the present disclosure, an RF circuit module includes a module substrate having electrodes for mounting components; a first substrate in which a first circuit is implemented; and a second substrate in which a second circuit is implemented. The first circuit includes a control circuit that controls an operation of the second circuit. The second circuit includes a radio-frequency amplifier circuit that amplifies an RF signal. The second substrate is mounted on the first substrate. The first substrate and the second substrate have a conductor layer that makes up a circuit-to-circuit connection wire that electrically connects the first circuit and the second circuit without intervening the module substrate. In a plan view of the module substrate, a top surface of the conductor layer that makes up the circuit-to-circuit connection wire is located at or below a top surface of the second circuit.

(3) Preferred embodiments of the present disclosure also provide a manufacturing method for an RF circuit module including a module substrate having electrodes for mounting components, a first substrate in which a first circuit including a control circuit is implemented, and a second substrate in which a second circuit including a radio-frequency amplifier circuit controlled by the control circuit is implemented. The manufacturing method includes forming the first circuit and a substrate-to-substrate connection conductor in an elemental semiconductor substrate that is the first substrate; forming a semiconductor thin film on a compound semiconductor substrate via a release layer, the semiconductor thin film having the second circuit and a substrate-to-substrate connection conductor, the semiconductor thin film being the second substrate; implementing the second substrate by removing the release layer through etching to release the semiconductor thin film from the compound semiconductor substrate; and implementing a laminated body made up of the first substrate and the second substrate by bonding the second substrate at a predetermined position of the first substrate to connect the substrate-to-substrate connection conductor of the first substrate and the substrate-to-substrate connection conductor of the second substrate. The method further includes forming a first substrate-side conductor protrusion connected to the first circuit and a second substrate-side conductor protrusion connected to the second circuit; and mounting the laminated body on the module substrate by connecting the first substrate-side conductor protrusion and the second substrate-side conductor protrusion to the electrodes of the module substrate.

(4) Preferred embodiments of the present disclosure also provide a manufacturing method for an RF circuit module including a module substrate having electrodes for mounting components, a first substrate in which a first circuit including a control circuit is implemented, and a second substrate in which a second circuit including a radio-frequency amplifier circuit controlled by the control circuit is implemented. The manufacturing method includes forming the first circuit in an elemental semiconductor substrate that is the first substrate; forming a semiconductor thin film on a compound semiconductor substrate via a release layer, the semiconductor thin film having the second circuit, the semiconductor thin film being the second substrate; and implementing the second substrate by removing the release layer through etching to release the semiconductor thin film from the compound semiconductor substrate. The method further includes implementing a laminated body made up of the first substrate and the second substrate by bonding the second substrate at a predetermined position of the first substrate; forming a substrate-to-substrate connection conductor that connects the first circuit and the second circuit; and mounting the laminated body on the module substrate.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 5 shows perspective views in steps of a manufacturing method for the second substrate and a method of bonding the second substrate to a first substrate;

FIG. 17 is a view showing a manufacturing method for a laminated body of a PA circuit element and the like according to the fourth embodiment;

DETAILED DESCRIPTION

Figure 1A:
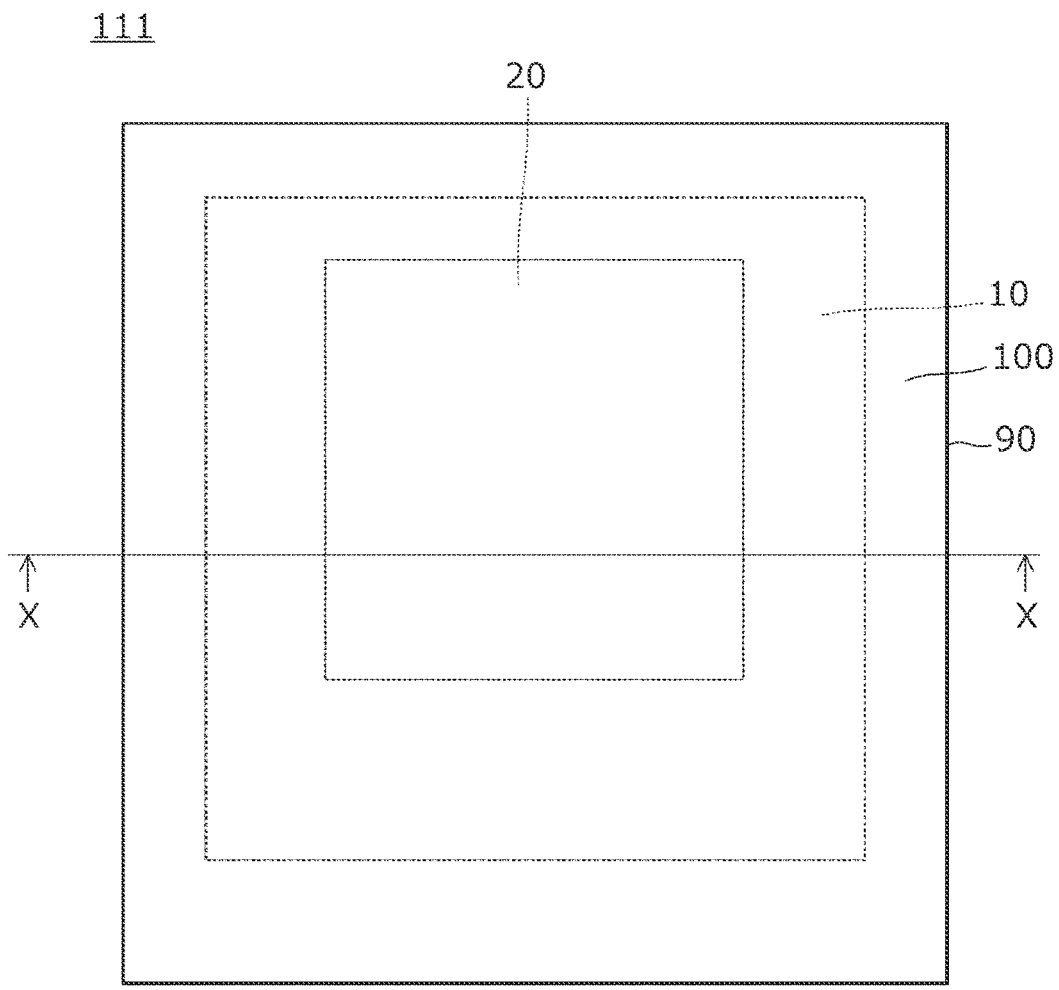
FIG. 1A is a plan view of an RF circuit module according to a first embodiment.

Hereinafter, a plurality of embodiments of the present disclosure will be described by using some specific examples with reference to the accompanying drawings. Like reference signs are assigned to the same portions in the drawings. In consideration of description of main points or easiness of understanding, a plurality of embodiments is described separately for the sake of convenience of description; however, partial replacements or combinations of components described in different embodiments are possible. From a second embodiment, the description of similar matters to those of a first embodiment is omitted, and only the differences will be described. Particularly, similar operation and advantageous effects with similar components will not be repeated one by one for each embodiment.

First Embodiment

In the first embodiment, an RF circuit module including basic components will be illustrated.

Figure 1B:
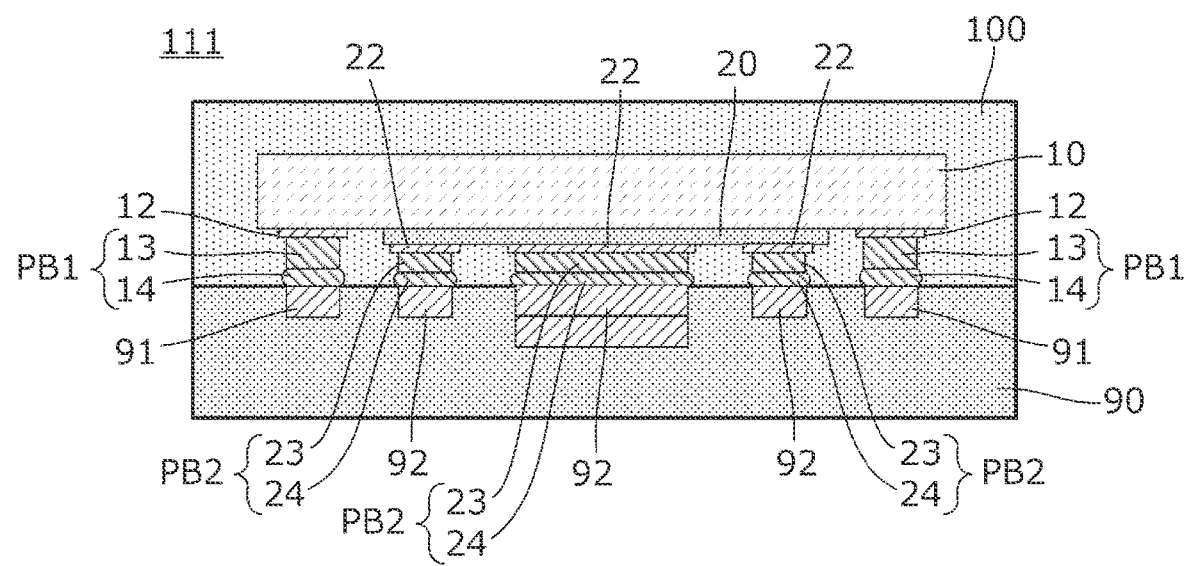
FIG. 1B is a cross-sectional view taken along the line X-X in FIG. 1A.

FIG. 1A is a plan view of an RF circuit module 111 according to the first embodiment. FIG. 1B is a cross-sectional view taken along the line X-X in FIG. 1A. The RF circuit module 111 includes a module substrate 90 having module substrate-side electrodes 91, 92 for mounting components, a first substrate 10 in which a first circuit is implemented, a second substrate 20 in which a second circuit is implemented, and a mold resin 100. The module substrate 90 is a printed circuit board (PCB) made up of a glass epoxy substrate or the like. A mold resin 100 is, for example, epoxy resin.

The first circuit includes a control circuit that controls the operation of the second circuit. The second circuit includes a radio-frequency amplifier circuit that amplifies an RF signal. The second substrate 20 is mounted on the first substrate 10. The first substrate 10 is flip-chip bonded to the module substrate 90 (mounted in a face-down position).

The first substrate 10 and the second substrate 20 have a circuit-to-circuit connection wire that electrically connects a circuit formed in the first substrate 10 and a circuit formed in the second substrate 20 without intervening the module substrate 90.

The first substrate 10 has first substrate-side electrodes 12 and first conductor pillar bumps PB1. The second substrate 20 has second substrate-side electrodes 22 and second conductor pillar bumps PB2. Each of the first conductor pillar bumps PB1 corresponds to the first substrate-side conductor protrusion according to preferred embodiments of the present disclosure. Each of the second conductor pillar bumps PB2 corresponds to the second substrate-side conductor protrusion according to preferred embodiments of the present disclosure.

Each of the first conductor pillar bumps PB1 is made up of a conductor pillar 13 formed on the first substrate-side electrode 12 of the first substrate 10, and a solder layer 14 applied to the distal end portion of the conductor pillar 13. Each of the second conductor pillar bumps PB2 is made up of a conductor pillar 23 formed on the second substrate-side electrode 22 of the second substrate 20, and a solder layer 24 applied to the distal end portion of the conductor pillar 23.

The conductor pillars 13, 23 are, for example, Cu plating films. The solder layers 14, 24 are, for example, SnAg alloy films.

The first circuit formed in the first substrate 10 and the second circuit formed in the second substrate 20 face an electrode forming surface of the module substrate 90.

Module substrate-side electrodes 91, 92 are formed in the module substrate 90. The first conductor pillar bumps PB1 of the first substrate 10 are connected to the module substrate-side electrodes 91 of the module substrate 90. The second conductor pillar bumps PB2 of the second substrate 20 are respectively connected to the module substrate-side electrodes 92 of the module substrate 90.

In this way, the first circuit formed in the first substrate 10 and the second circuit formed in the second substrate 20 face the electrode forming surface of the module substrate 90 and are connected to the module substrate-side electrodes 91, 92 of the module substrate 90 via the first conductor pillar bumps PB1 and the second conductor pillar bumps PB2. For this reason, paths between the first circuit and a module substrate 90-side circuit and paths between the second circuit and the module substrate 90-side circuit each are shortest. Therefore, the degradation of electrical characteristics in signal paths is suppressed.

After a power amplifier module (PA circuit element 3 (described later)) including the first substrate 10 and the second substrate 20 is mounted on the module substrate 90, the surface of the module substrate 90 is sealed with a mold resin 100.

Figure 2A:
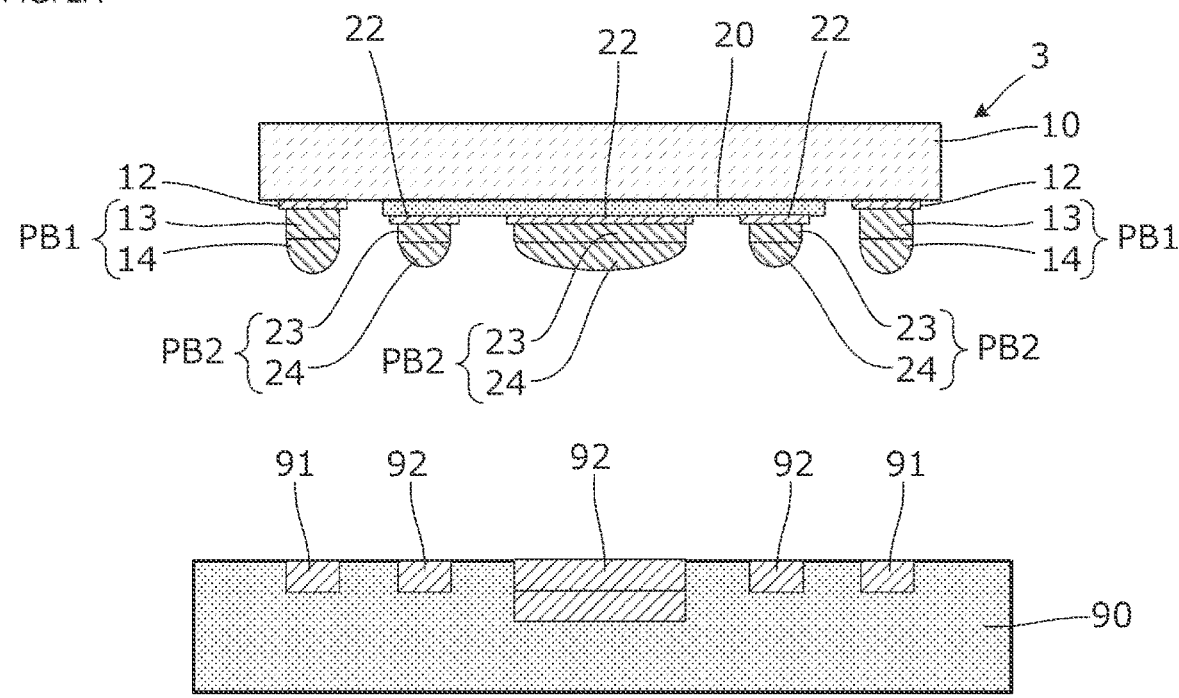
FIG. 2A and FIG. 2B are views showing a manufacturing process for the RF circuit module.
Figure 2B:
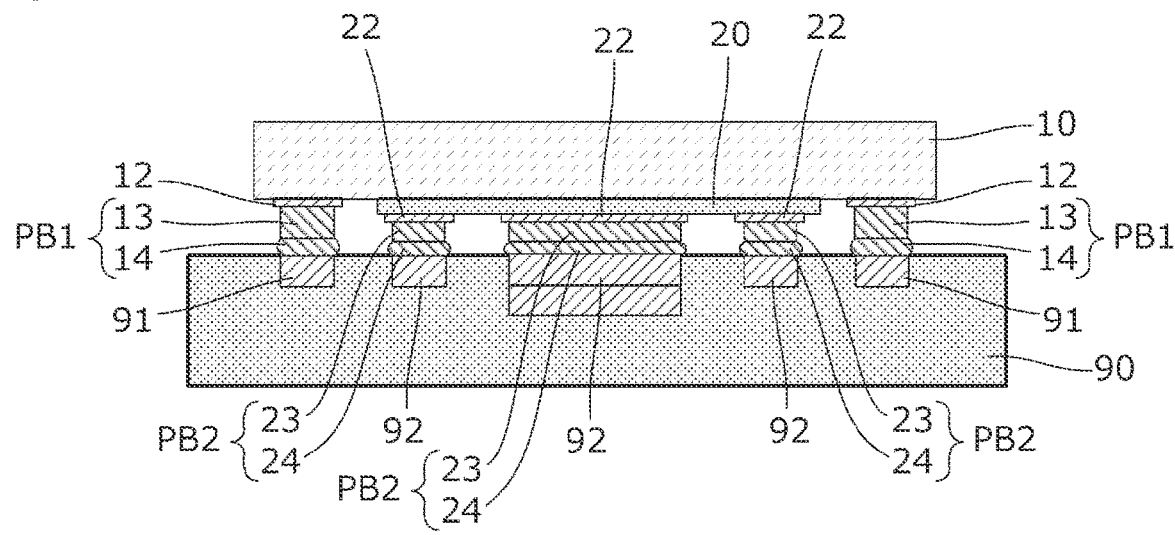

FIG. 2A and FIG. 2B are views showing a manufacturing process for the RF circuit module 111. FIG. 2A is a cross-sectional view showing a state just before the PA circuit element 3 including the first substrate 10 and the second substrate 20 is mounted on the module substrate 90. FIG. 2B is a cross-sectional view showing a state where the PA circuit element 3 is mounted on the module substrate 90.

A method of forming the PA circuit element 3 will be described later. The first conductor pillar bumps PB1 and the second conductor pillar bumps PB2 are formed on the under surface of the PA circuit element 3. The first conductor pillar bumps PB1 and second conductor pillar bumps PB2 of the PA circuit element 3 are aligned with the module substrate 90 and heated under pressure. As a result, as shown in FIG. 2B, the solder layers 14, 24 of the first conductor pillar bumps PB1 and second conductor pillar bumps PB2 of the PA circuit element 3 are connected to the module substrate-side electrodes 91, 92.

Figure 3:
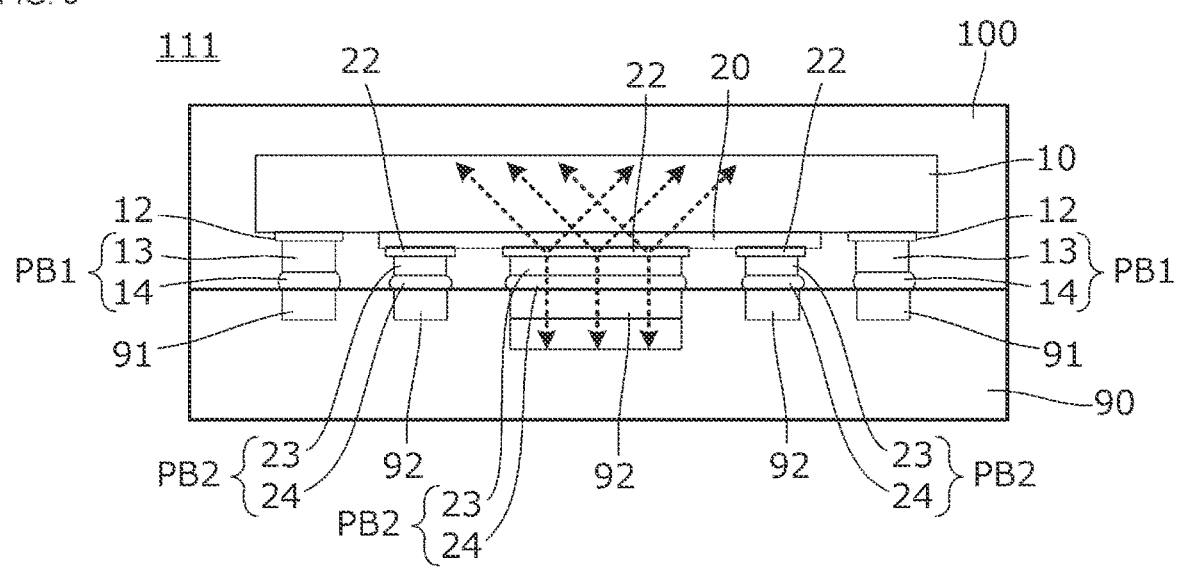
FIG. 3 is a view showing two heat conduction paths that are heat radiation paths from a circuit element formed in a second substrate in the RF circuit module.

FIG. 3 is a view showing two heat conduction paths that are heat radiation paths from circuit elements formed in the second substrate 20 in the RF circuit module 111. In FIG. 3, the dashed arrows represent the two heat conduction paths. The first heat conduction path is made up of the second substrate-side electrodes 22 and the second conductor pillar bumps PB2. Heat generated by the circuit elements passes through the first heat conduction path and is radiated and exhausted to the module substrate-side electrodes 92 and the module substrate 90. The second heat conduction path is a heat conduction path in a direction from the second substrate 20 to the first substrate 10. Heat generated by the circuit elements is radiated and exhausted via the second heat conduction path.

The second conductor pillar bumps PB2 are provided nearest to the second substrate-side electrodes 22 that are part of the second circuit formed in the second substrate 20. Therefore, the heat radiation and exhaust heat efficiency is high.

The height of each first conductor pillar bump PB1 is less than the thickness of the first substrate 10. Therefore, in comparison with the case where the first substrate 10 on which the second substrate 20 is mounted is connected to the module substrate 90 by means of a mounting technology, such as wire bonding, wire length is shortened, and loop inductance is reduced.

Figure 4:
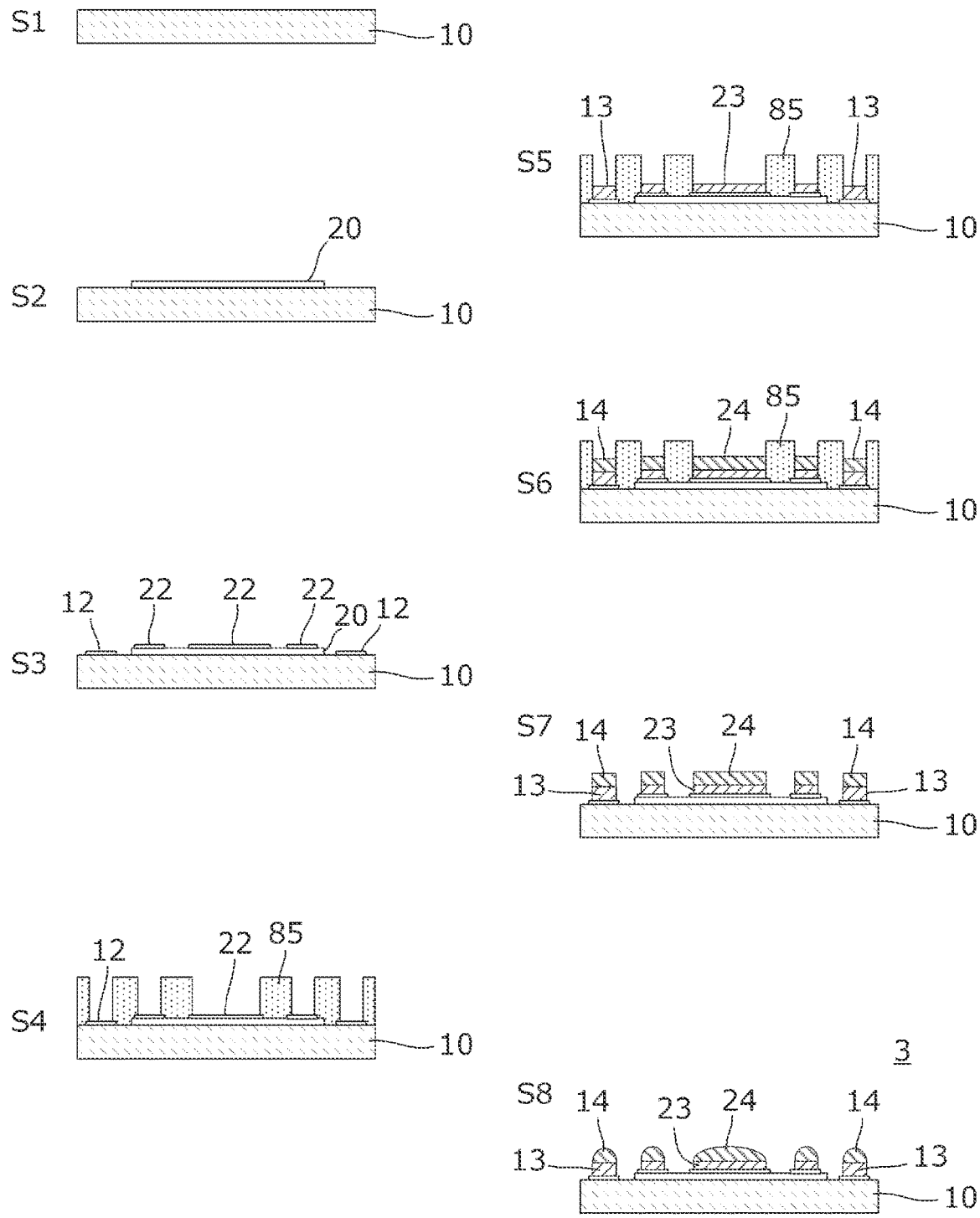
FIG. 4 is a view showing a manufacturing method for a PA circuit element.

Next, a manufacturing method for the RF circuit module 111 will be illustrated. FIG. 4 is a view showing a manufacturing method for the PA circuit element 3. The diagrams from step S1 to step S7 in FIG. 4 are cross-sectional views in process of manufacturing the PA circuit element 3. Step S8 is a cross-sectional view of the completed PA circuit element 3. Manufacturing is actually performed wafer by wafer. FIG. 4 shows a single semiconductor device.

Initially, as shown in step Si in FIG. 4, the first substrate 10 made up of an Si substrate is disposed. When needed, a bonding layer may be formed on the surface of the first substrate 10 made up of the Si substrate with a general semiconductor process. The bonding layer is a metal film, such as an Au film, an organic material film, such as a polyimide (PI) film, a polybenzoxazole (PBO) film, and a benzocyclobutene (BCB) film, or an insulator, such as AlN, SiC, and diamond.

Next, as shown in step S2, the second substrate 20 is bonded onto the first substrate 10. Circuit elements and electrodes are already formed in the second substrate 20 in a separate step.

Subsequently, as shown in step S3, the second substrate-side electrodes 22 are formed on the second substrate 20 and the first substrate-side electrodes 12 are formed on the first substrate 10 by means of a general semiconductor process.

Subsequently, as shown in step S4, a resist film 85 having openings in regions in which the conductor pillars 13 and the solder layers 14 (FIG. 2A and FIG. 2B) should be formed is formed. The electrodes 12, 22 are exposed to the insides of the openings of the resist film 85.

After that, as shown in step S5 and step S6, the conductor pillars 13, 23 and the solder layers 14, 24 are deposited by plating on the electrodes 12, 22 exposed to the insides of the openings of the resist film 85. The conductor pillars 13, 23 are made of Cu and has a thickness of, for example, about 40 wn. In this way, copper pillar bumps (CPBs) are formed. The solder layers 14, 24 are made of an SnAg alloy and have a thickness of, for example, about 30 μm After that, as shown in step S7, the resist film 85 is removed. Finally, a reflow process is performed to fuse the solder layers 14, 24 and solidified, with the result that the PA circuit element 3 is obtained as shown in step S8.

FIG. 5 shows perspective views in steps of a manufacturing method for the second substrate 20 and a method of bonding the second substrate 20 to the first substrate 10. Manufacturing is actually performed wafer by wafer. FIG. 5 shows a single semiconductor device.

As shown in step S11 in FIG. 5, initially, a release layer 29 is formed on a motherboard 200 that is a compound semiconductor substrate, a semiconductor thin film is formed on the top of the release layer 29 by means of an epitaxial growth method, and a plurality of circuit elements and electrodes connected to the circuit elements are formed in the semiconductor thin film. This portion will be the second substrate 20 later.

Subsequently, as shown in step S12, the second substrate 20 (semiconductor thin film piece) is released from the motherboard 200 by performing a process of selectively etching only the release layer 29.

After that, as shown in step S13, the second substrate 20 is bonded to the first substrate 10. In other words, the second substrate 20 that is the semiconductor thin film piece is transferred from the motherboard 200 to the first substrate 10. This bonding is performed by van der Waals bond or hydrogen bond. Other than those, the bonding may be performed by electrostatic force, covalent bond, eutectic alloy bond, or the like. In a separate step, an Au film may be formed on the first substrate 10 as a bonding layer, and the second substrate 20 may be brought into close contact with the surface of the bonding layer under pressure to diffuse Au of the bonding layer in the GaAs layer of the second substrate 20 to be eutectic.

Formation of circuit elements and electrodes in the second substrate 20 may be performed not only at the stage shown in step S11 but also, as shown in step S14, in a process applied to the second substrate 20 (photolithography etching step) after bonding the second substrate 20 to the first substrate 10.

The method described in Japanese Patent No. 5132725 may be applied to a method of peeling and transferring the semiconductor thin film piece. In other words, as shown in step S12 in FIG. 5, when the second substrate 20 (semiconductor thin film piece) is peeled from the motherboard 200, the second substrate 20 is peeled from the motherboard 200 in a state where the second substrate 20 is supported by a support. Also, as shown in step S13 in FIG. 5, when the second substrate 20 is bonded to the first substrate 10, the second substrate 20 is bonded in a state where the second substrate 20 is supported by the support. In step S12 and step S13 in FIG. 5, for the sake of clear illustration of the second substrate 20, the support is not shown.

The thus configured RF circuit module 111 of the present embodiment has the following advantageous effects.

(a) Since the first substrate 10 is flip-chip bonded to the module substrate 90 (mounted in a face-down position), no space for disposing pads or wires for wire bonding is needed, so the size is reduced as a whole.

(b) The circuit formed in the first substrate 10 and the circuit formed in the second substrate 20 are electrically connected by the substrate-to-substrate connection conductor without intervening the module substrate 90, the first substrate 10 has the first conductor pillar bumps PB1 connected to the electrodes of the module substrate 90, and the second substrate 20 has the second conductor pillar bumps PB2 connected to the electrodes of the module substrate 90. Therefore, no wire for connecting the circuit formed in the first substrate 10 and the circuit formed in the second substrate 20 needs to be formed on or in the module substrate 90, so the size is reduced as a whole.

(c) Since heat generated by the radio-frequency amplifier circuit formed in the second substrate 20 is radiated and exhausted with high efficiency, the RF circuit module reduced in size without constraints to heat radiation property or the RF circuit module having a high heat radiation property with a small size is obtained.

Second Embodiment

In the second embodiment, an RF circuit module configured as a front-end module will be illustrated.

Figure 6A:
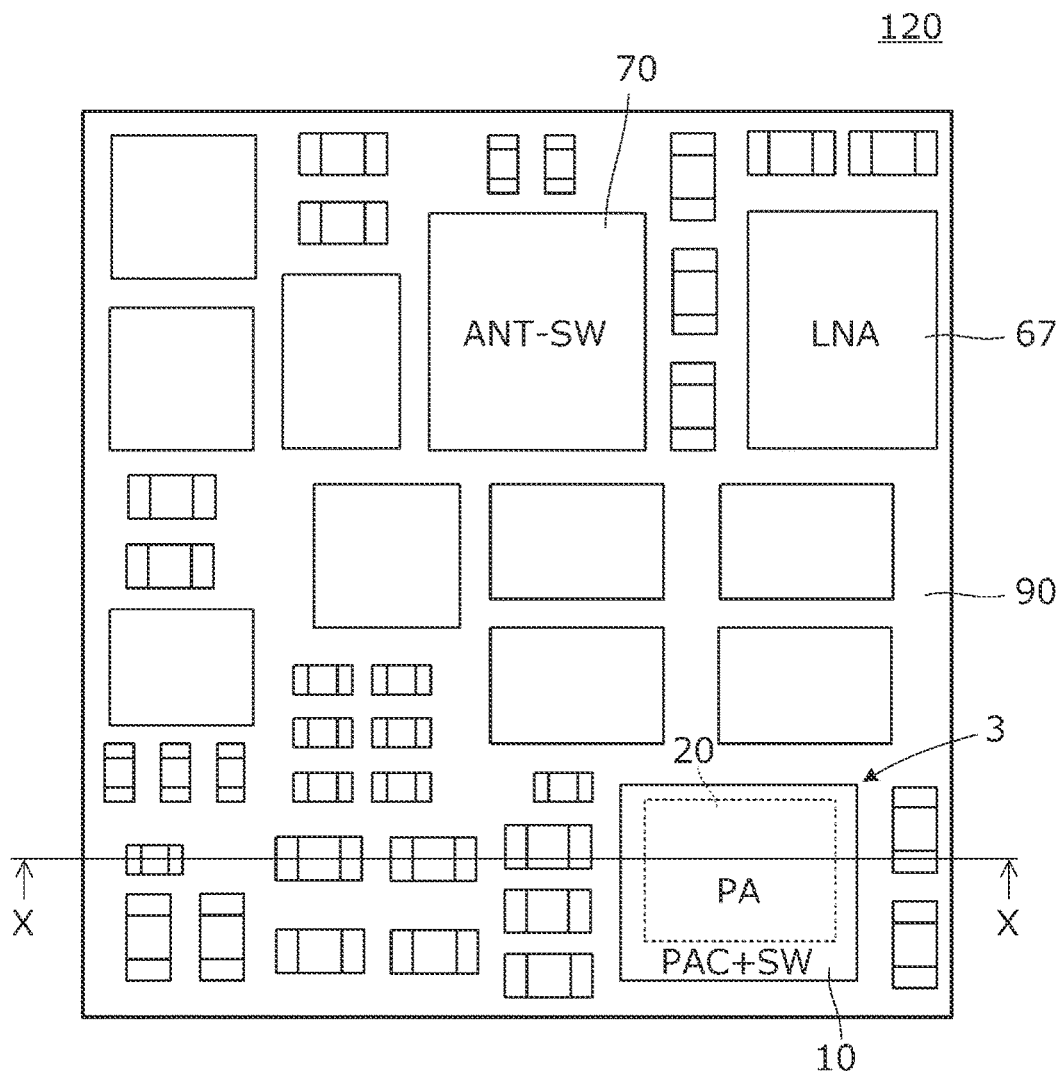
FIG. 6A is a plan view of a front-end module according to a second embodiment.
Figure 6B:
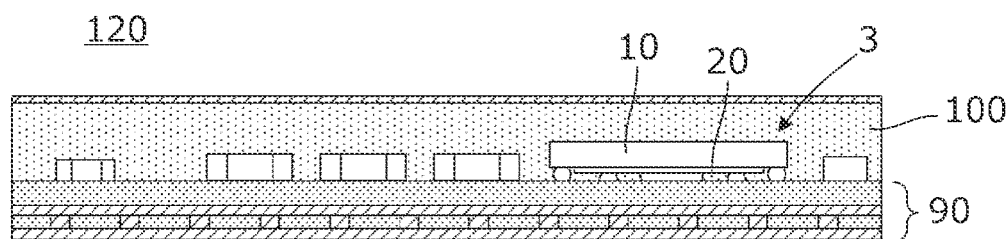
FIG. 6B is a cross-sectional view taken along the line X-X in FIG. 6A.

FIG. 6A is a plan view of a front-end module 120 according to the second embodiment. FIG. 6B is a cross-sectional view taken along the line X-X in FIG. 6A. FIG. 6A is a plan view in a state where a top shield layer and a mold resin (described later) are not shown.

The front-end module 120 is a circuit connected between an antenna and both a transmitting circuit and a receiving circuit. The front-end module 120 is made such that a plurality of chip components is implemented on a module substrate 90. A ground conductor is formed in each of internal layers and lowermost layer of the module substrate 90. An antenna switch 70, a low noise amplifier 67, a PA circuit element 3, a duplexer, a chip inductor, a chip capacitor, and the like are implemented on the module substrate 90. The top of the module substrate 90 is sealed with a mold resin 100, and a metal layer for shielding the top is formed on the surface of the mold resin 100.

The PA circuit element 3 is a PA module made up of a first substrate 10 and a second substrate 20. A switch used to select one of two-line transmission signals (described later) and a control circuit of a radio-frequency amplifier are formed in the first substrate 10. A radio-frequency amplifier circuit is implemented in the second substrate 90.

Figure 7:
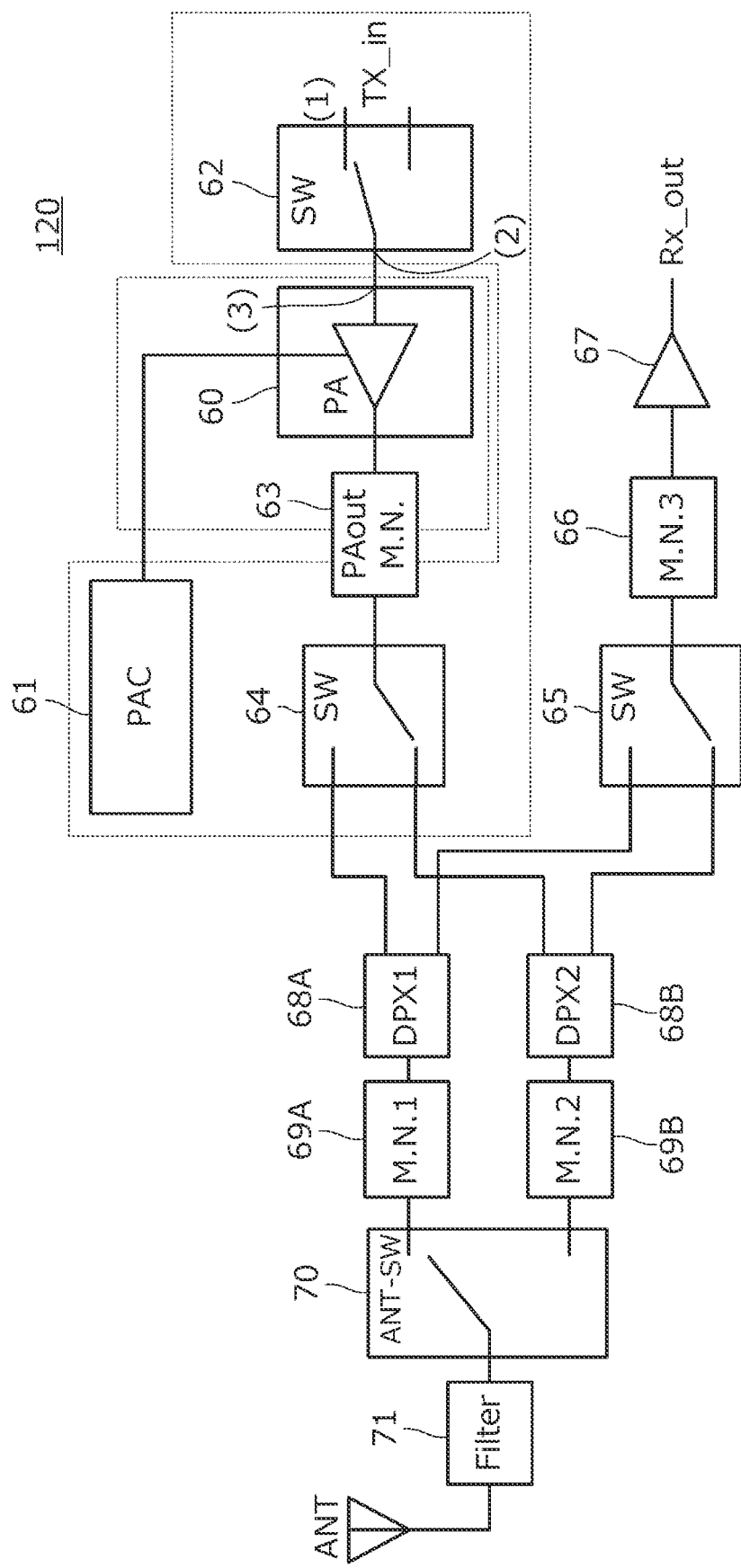
FIG. 7 is a block diagram showing the circuit configuration of the front-end module according to the second embodiment.

FIG. 7 is a block diagram showing the circuit configuration of the front-end module 120 according to the present embodiment. The front-end module 120 includes a band pass filter 71 connected to an antenna ANT, the antenna switch 70, impedance matching circuits 69A, 69B, duplexers 68A, 68B, a switch 65, an impedance matching circuit 66, the low noise amplifier 67, a switch 62, a radio-frequency amplifier 60, a radio-frequency amplifier control circuit 61, an impedance matching circuit 63, and a switch 64.

The switch 62 and the radio-frequency amplifier control circuit 61 are formed in the first substrate 10. The radio-frequency amplifier 60 is formed in the second substrate 20.

In FIG. 7, the antenna switch 70 is a switch that selectively connects the antenna to one of the two transmitting and receiving circuit lines. The low noise amplifier 67 is a first-stage amplifier for a reception signal.

Figure 24A:
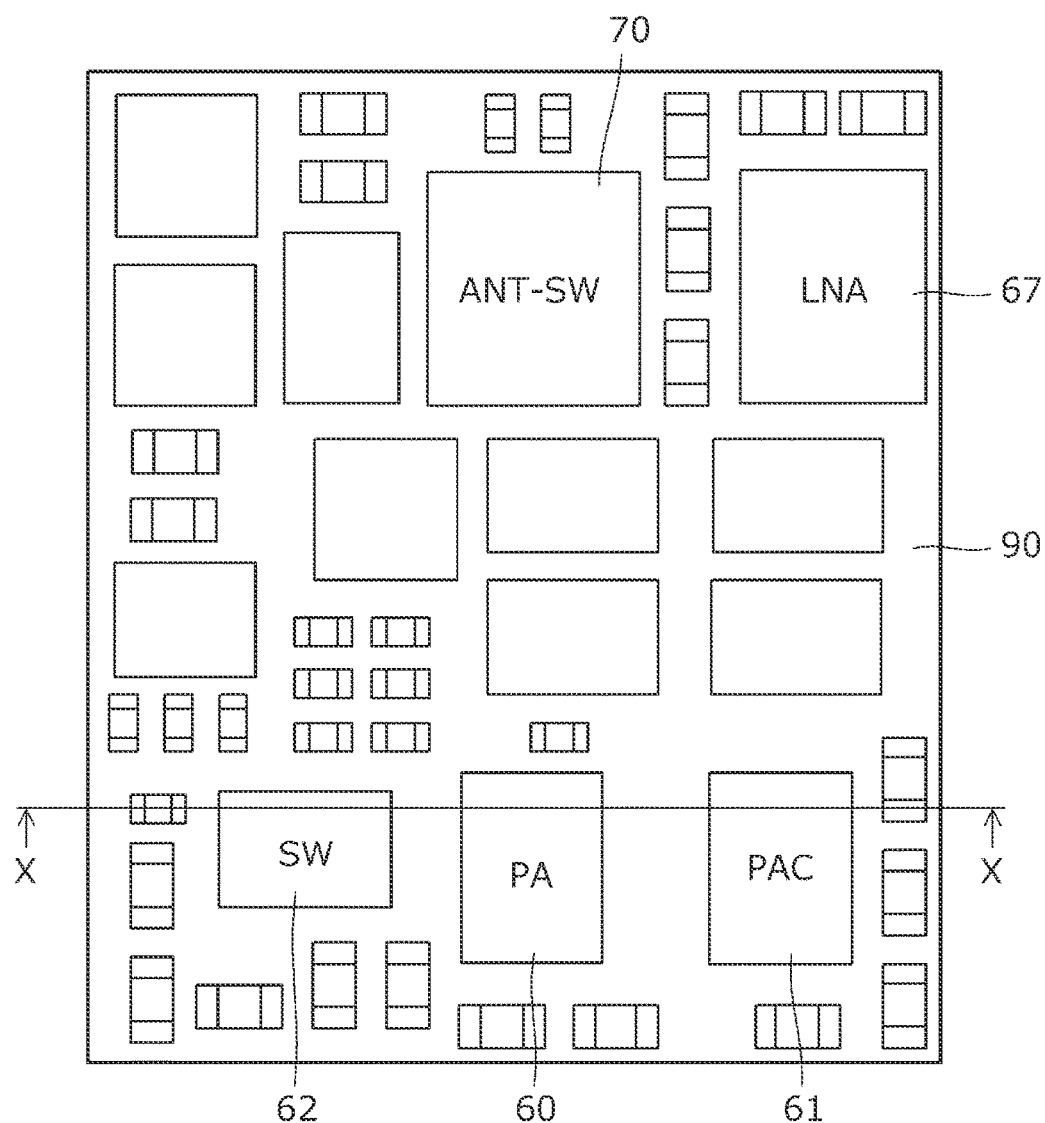
FIG. 24A and FIG. 24B are diagrams showing the configuration of a front-end module as a comparative example to the front-end module according to the second embodiment.
Figure 24B:
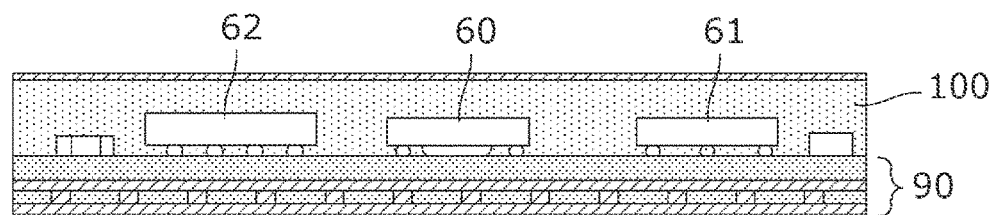
Figure 25A:
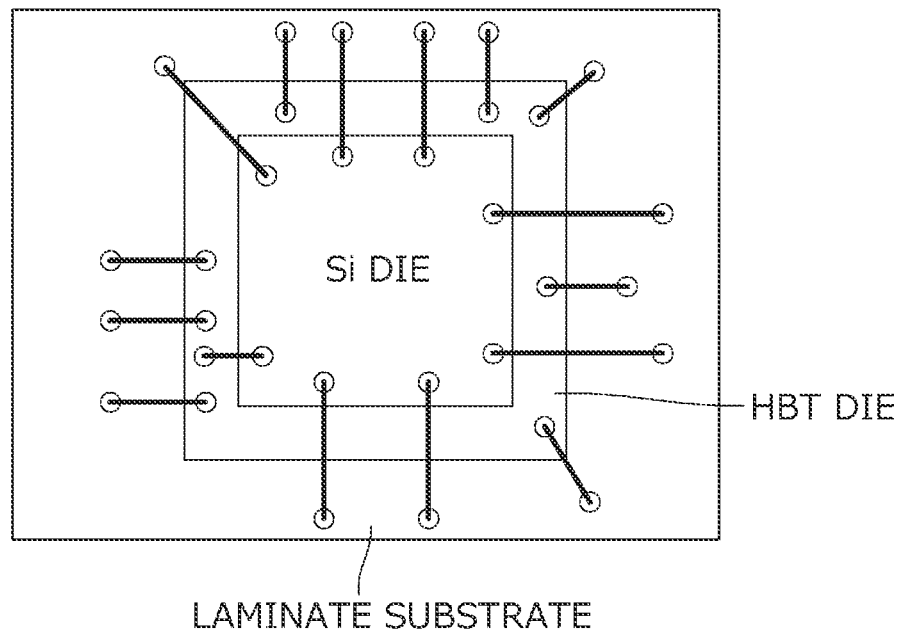
FIG. 25A is a plan view of a device having a similar configuration to that of the device described in U.S. Patent Application Publication No. 2015/0303971.
Figure 25B:
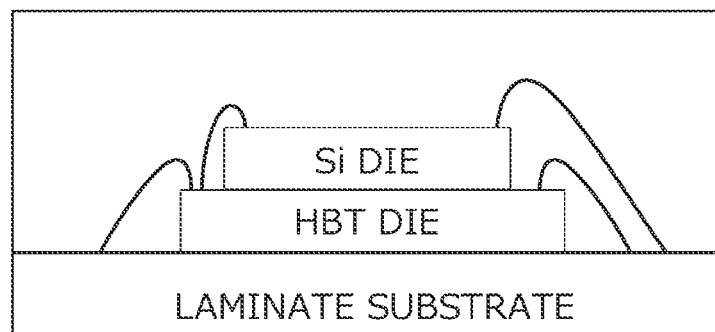
FIG. 25B is a cross-sectional view of the device shown in FIG. 25A.

FIG. 24A and FIG. 24B show a configuration example of a front-end module as a comparative example to the front-end module according to the second embodiment. FIG. 24B is a cross-sectional view taken along the line X-X in FIG. 24A. Different from the example shown in FIG. 6A and FIG. 6B, the front-end module includes a radio-frequency amplifier 60, a radio-frequency amplifier control circuit 61, and a switch 62, each of which is an individual component.

According to the second embodiment, as is apparent from a comparison with the front-end module as the comparative example shown in FIG. 24A and FIG. 24B, a footprint of electronic components on the module substrate 90 is reduced. In addition, the wire length between the radio-frequency amplifier 60 and the switch 62 and the wire length between the radio-frequency amplifier 60 and the radio-frequency amplifier control circuit 61 are shortened, so a signal loss and impedance mismatching are reduced.

Since the switch 62 and the radio-frequency amplifier control circuit 61 are implemented in the first substrate 10, the size adequately increases as compared to the size of the switch 62 alone or the size of the radio-frequency amplifier control circuit 61 alone, so it is easy to form the PA circuit element 3 that is a laminated body of the first substrate 10 and the second substrate 20 in which the radio-frequency amplifier 60 is formed. Since the PA circuit element 3 is made up of the laminated body of the first substrate 10 and the second substrate 20, the efficiency of reduction in the area of the front-end module 120 increases.

In an existing configuration in which, for example, a GaAs substrate is connected by wire bonding or bumps, a thick GaAs substrate is needed for handling the substrate. In the present embodiment, the thin second substrate 20 that is, for example, a GaAs substrate is bonded to the first substrate 10 that is, for example, an Si substrate, so a low profile is achieved even with a stack of two chips.

Third Embodiment

In the third embodiment, some configuration examples of an RF circuit module including a PA circuit element will be described.

Figure 8:
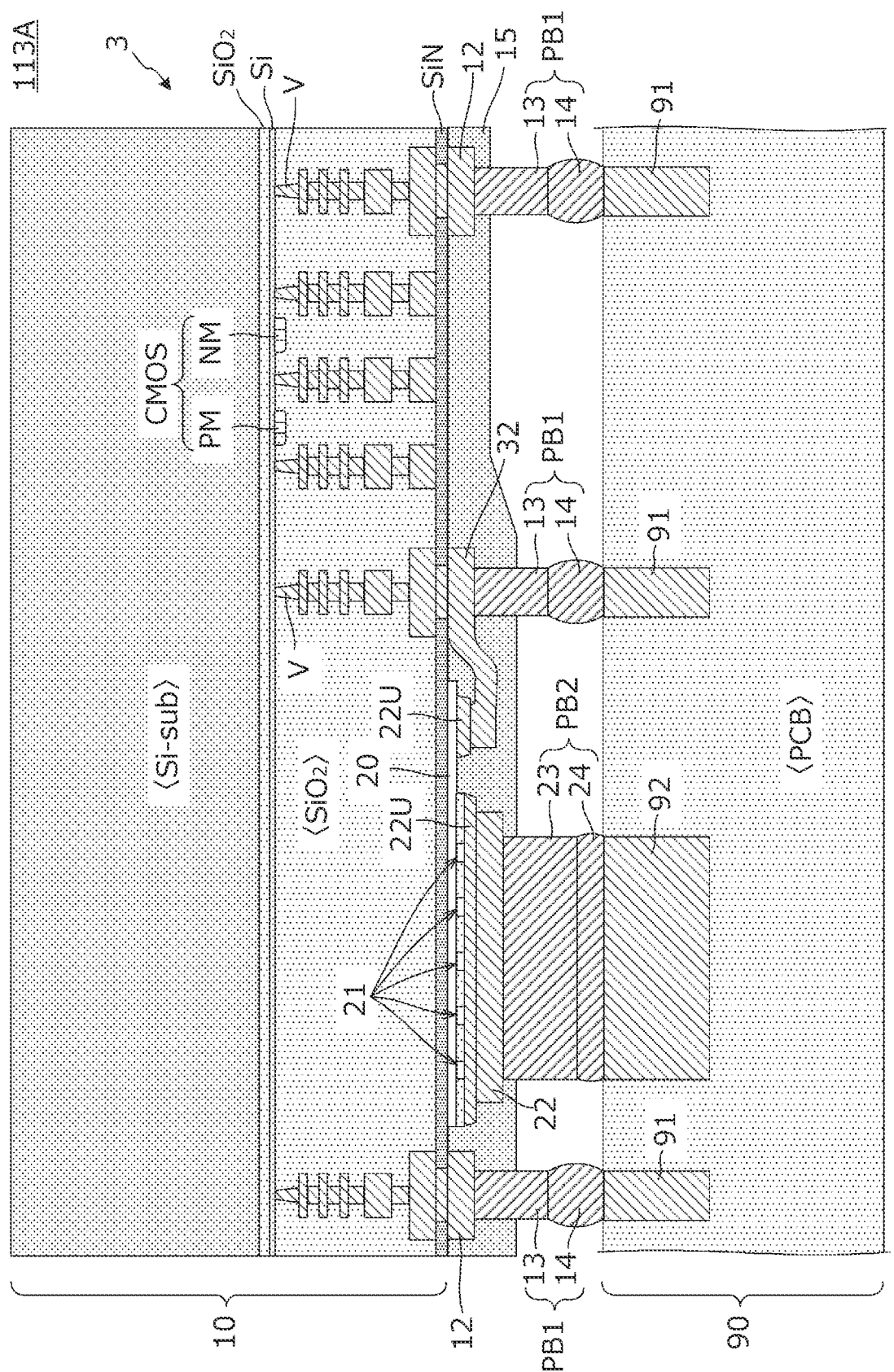
FIG. 8 is a partially cross-sectional view of an RF circuit module according to a third embodiment.

FIG. 8 is a partially cross-sectional view of an RF circuit module 113A according to the third embodiment. FIG. 8 shows part of the module substrate 90 on which the PA circuit element 3 is implemented and the cross section of the PA circuit element 3.

Module substrate-side electrodes 91, 92 for mounting components are formed in the module substrate 90 made up of a printed circuit board (PCB). The PA circuit element 3 includes first conductor pillar bumps PB1 and a second conductor pillar bump PB2. The first conductor pillar bumps PB1 and second conductor pillar bump PB2 of the PA circuit element 3 are connected to the module substrate-side electrodes 91, 92 of the module substrate 90, with the result that the PA circuit element 3 is mounted in a face-down position. The structures of the first conductor pillar bumps PB1 and second conductor pillar bump PB2 are as described in the first embodiment.

The PA circuit element 3 includes a first substrate 10 and a second substrate 20. In the first substrate 10, an $SiO_2$ layer as an electrically insulating layer, an Si layer as a device layer, an $SiO_2$ layer as a wire forming layer, and an SiN layer as a passivation layer are formed on an Si substrate Si-sub in this order.

A plurality of circuit elements 21 and electrodes used to apply operating voltage or pass operating current to the plurality of circuit elements 21 are formed in the second substrate 20. The second substrate 20 is formed in a separate step as shown in FIG. 5 in the first embodiment, and the circuit elements are formed on the epitaxial layer. The epitaxial layer has a thickness of, for example, about 3 μm. The electrodes (wiring layer) have a thickness of about 10 μm.

First substrate-side electrodes 12, a second substrate-side electrode 22, and a circuit-to-circuit connection wire 32, as a rewiring layer, are formed on the surface of the SiN layer. During manufacturing, a conductor layer that makes up the circuit-to-circuit connection wire 32 is made up of the same layer as the second substrate-side electrodes 22 (the conductor layer that makes up the second circuit according to preferred embodiments of the present disclosure).

As represented in FIG. 8, one of the first conductor pillar bumps PB1 is directly in contact with the conductor layer that makes up the circuit-to-circuit connection wire 32. Therefore, part of the first circuit and part of the second circuit are connected through a short path, and are also connected to a module substrate-side circuit through a short path.

The surfaces of the first substrate-side electrodes 12, second substrate-side electrode 22, and circuit-to-circuit connection wire 32 are coated with a resin layer 15 in an electrically insulating manner.

In the present embodiment, the first substrate 10 is an elemental semiconductor substrate and is mainly made of, for example, Si or Ge. The first substrate 10 may be made of a plurality of materials including GaAs, AlAs, InAs, InP, GaP, InSb, GaN, InN, AlN, SiC, $Ga_2O_3$, diamond-like carbon (DLC), graphite, diamond, glass, sapphire, and $Al_2O_3$.

In the present embodiment, the second substrate 20 is a compound semiconductor substrate and is made of any one of, for example, GaAs, AlAs, InAs, InP, GaP, InSb, GaN, InN, AlN, SiGe, SiC, $Ga_2O_3$, and GaBi. The second substrate 20 may be a multinary mixed crystal made of a plurality of materials selected from among these materials.

A material selected for the first substrate 10 and a material selected for the second substrate 20 are different from each other, and a manufacturing process for the first substrate 10 and a manufacturing process for the second substrate 20 are different from each other. Basically, it is desirable that, for example, the second substrate 20 be a material by which predetermined electrical characteristics including amplification rate, cut-off frequency, and the like are obtained and the first substrate 10 be selected to have a higher thermal conductivity than the second substrate 20.

In the present embodiment, the first substrate 10 is an Si substrate, and the second substrate 20 is a GaAs substrate. The thermal conductivity of the Si substrate is about 156. The thermal conductivity of the GaAs substrate is about 46. The circuit elements 21 are, for example, heterojunction bipolar transistors (HBTs) in which a plurality of unit transistors is connected in parallel with one another, and are formed by applying a process to the GaAs substrate that is the second substrate 20. The conductor pillar bump PB2 is electrically connected to the emitters of the plurality of unit transistors. The plurality of unit transistors is arranged in a first direction (right and left direction in FIG. 1A and FIG. 1B), and the conductor pillar bump PB2 is formed in substantially a shape that also extends in the first direction.

Figure 9:
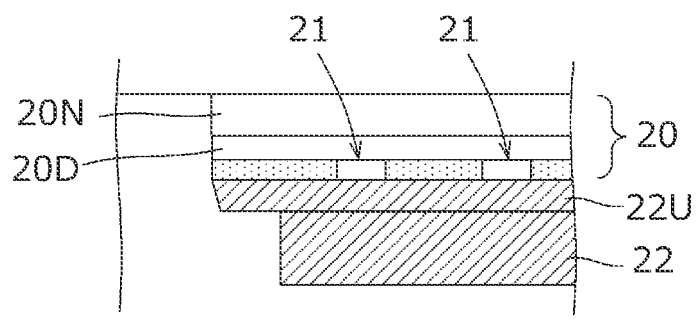
FIG. 9 is a partially enlarged view showing the configuration of HBTs formed in the second substrate.

FIG. 9 is a partially enlarged view showing the configuration of the HBTs formed in the second substrate 20. The second substrate 20 includes a GaAs substrate 20N and an epitaxial layer 20D formed on the surface of the GaAs substrate 20N. The circuit elements 21 (HBTs) are formed on the epitaxial layer 20D. The second substrate 20 is a common collector. The emitters of the plurality of HBTs are connected in common at a base electrode 22U and the second substrate-side electrode 22.

In FIG. 8, for example, a CMOS circuit made up of a p-channel MOS PM and an n-channel MOS NM is formed in the Si layer as the device layer. A wire that extends a circuit formed in the Si layer as the device layer, to the first substrate-side electrodes 12 and the circuit-to-circuit connection wire 32 is formed between the Si layer as the device layer and the SiN layer as the passivation layer. The wire is made up of a plurality of wiring layers made of Cu or Al and vias V made of Cu or Al connecting the wiring layers.

Figure 10:
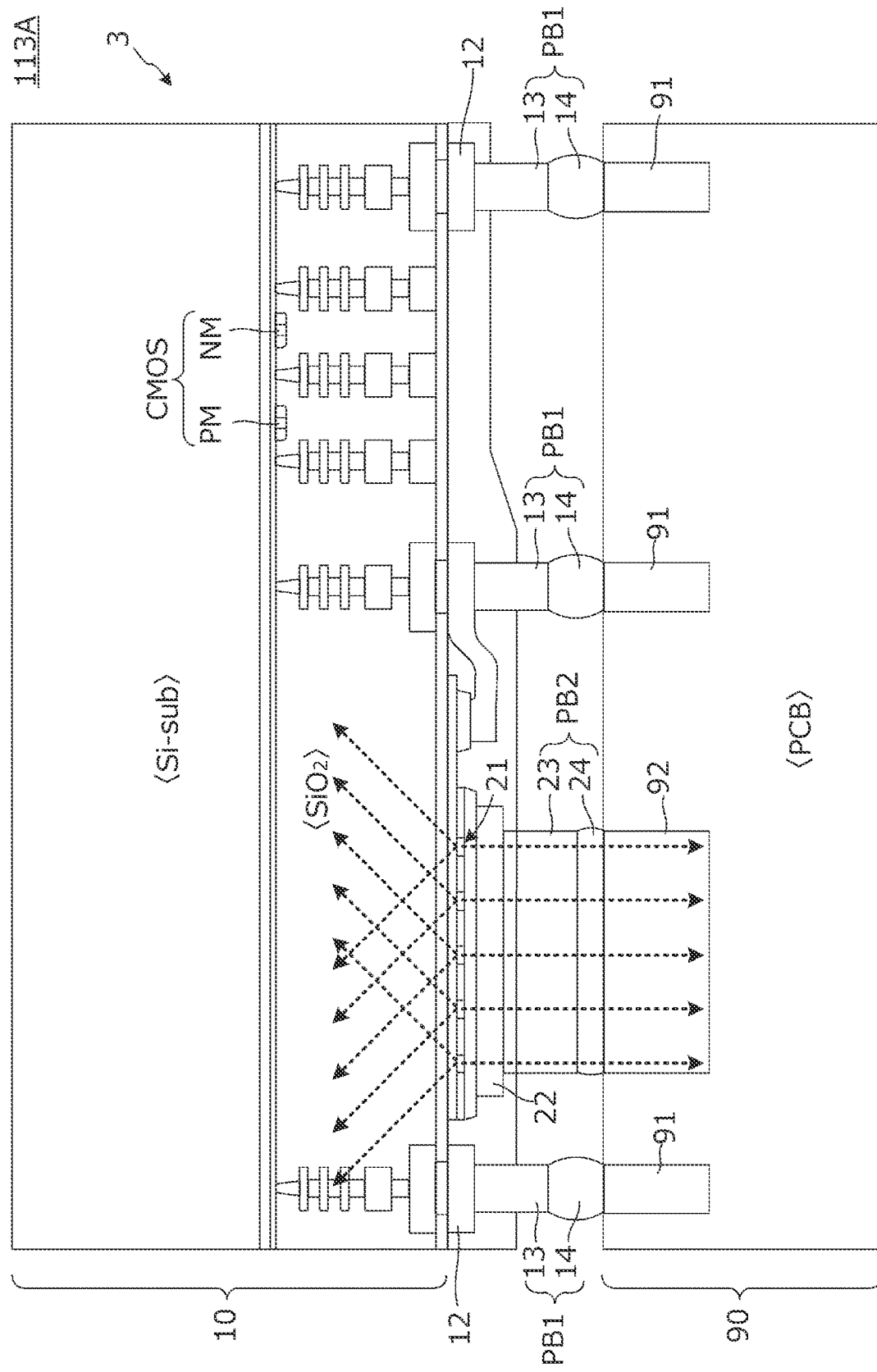
FIG. 10 is a diagram showing two heat conduction paths that are hear radiation paths from circuit elements in the RF circuit module.

FIG. 10 is a diagram showing two heat conduction paths that are hear radiation paths from the circuit elements 21 in the RF circuit module 113A. In FIG. 10, the dashed arrows represent the two heat conduction paths. The first heat conduction path is made up of the second substrate-side electrode 22 and the second conductor pillar bump PB2. Heat generated by the circuit elements 21 passes through the first heat conduction path and is radiated and exhausted to the module substrate-side electrode 92 and the module substrate 90. The second heat conduction path is a heat conduction path in a direction from the second substrate 20 to the first substrate 10. Heat generated by the circuit elements 21 is radiated and exhausted via the second heat conduction path.

The thermal conductivity of the $SiO_2$ layer as the wire forming layer is about 1.0 [W/cm K]. The thermal conductivity of the Si substrate is about 156 [W/cm K]. The thermal conductivity of the GaAs substrate is about 46 [W/cm K]. In other words, the thermal conductivity of the first substrate 10 is higher than the thermal conductivity of the second substrate 20. Therefore, the first substrate 10 works as a high-efficiency thermal radiator. Since the first substrate 10 works as a heat conduction path in this way, the conductor pillars 13, the solder layers 14, and the module substrate-side electrodes 91 also work as a heat conduction path.

In the examples shown in FIG. 8 and FIG. 10, the effect of radiating and exhausting heat toward the module substrate 90 is high, so thermal influence on the CMOS circuit and the like is suppressed.

With the thus configured RF circuit module 113A, as in the case of the example shown in the first embodiment, the RF circuit module reduced in size as a whole with high heat radiation property is obtained.

Figure 11:
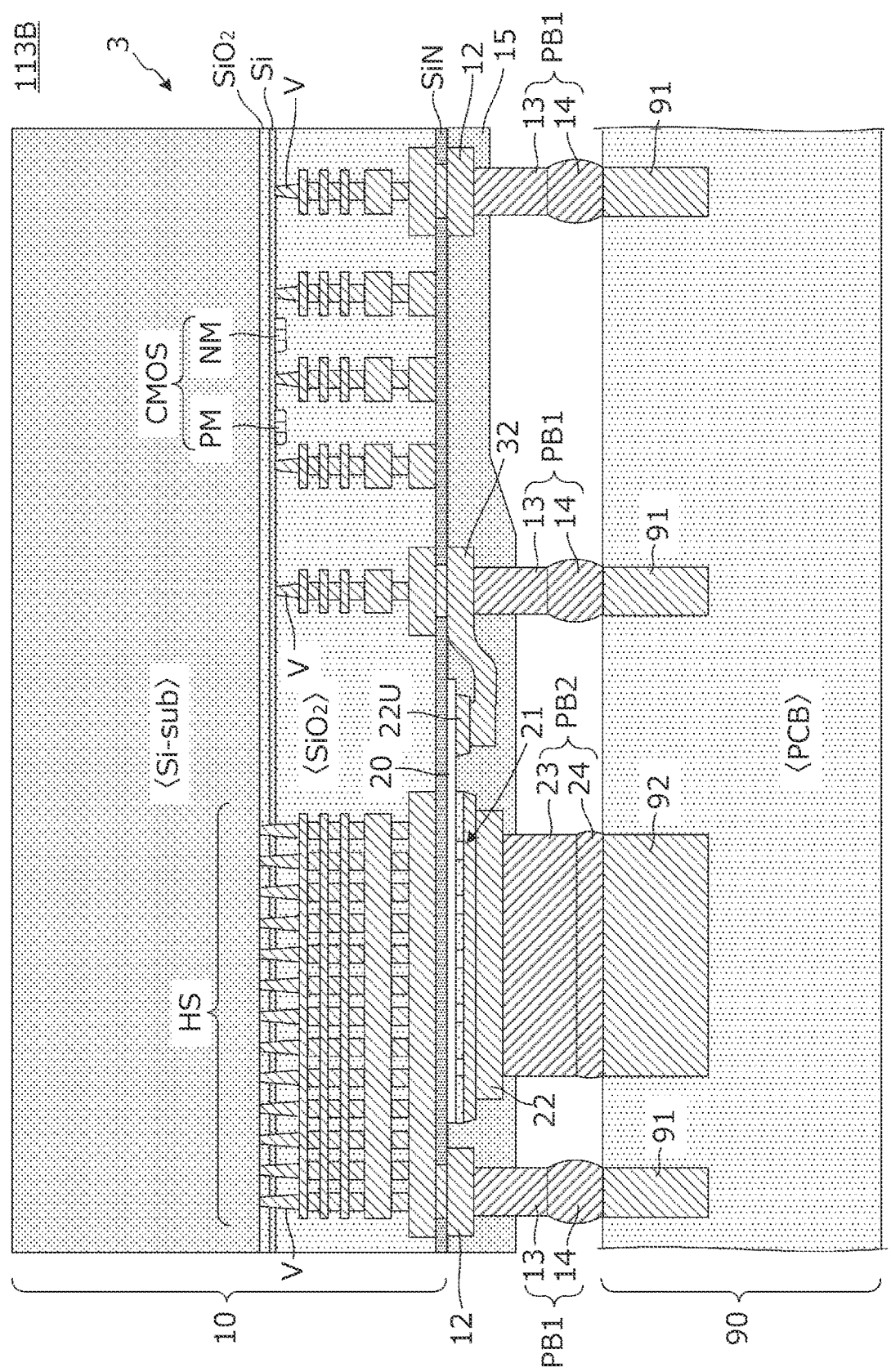
FIG. 11 is a partially cross-sectional view of another RF circuit module according to the third embodiment.

FIG. 11 is a partially cross-sectional view of another RF circuit module 113B according to the third embodiment. The RF circuit module 113B differs from the RF circuit module 113A shown in FIG. 8 in that a heat spreader HS is provided. In the RF circuit module 113B, not only a wire that extends a circuit formed in the Si layer as the device layer, to the first substrate-side electrodes 12 is formed in the $SiO_2$ layer as the wire forming layer but also the heat spreader HS is formed near the circuit elements 21 that are HBTs. The heat spreader HS is made up of a plurality of wiring layers made of Cu or Al and vias V made of Cu or Al connecting the wiring layers.

Figure 12:
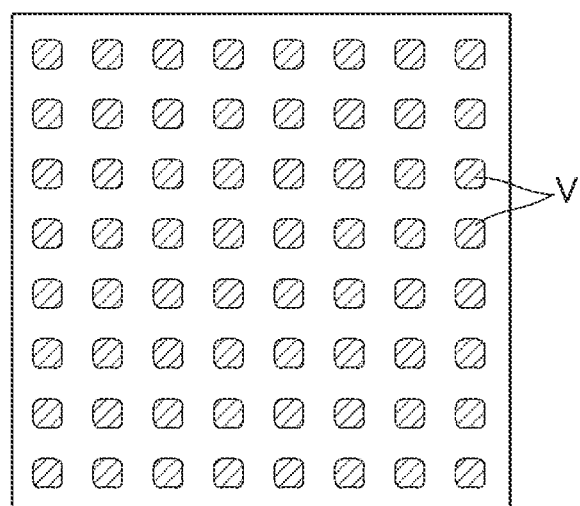
FIG. 12 is a cross-sectional view of a heat spreader in a via layer.

FIG. 12 is a cross-sectional view of the heat spreader HS in a via layer. In this way, the conductor of the wiring layers that make up the heat spreader HS expands in substantially a plane, and a large number of vias are arranged in a plane direction. In this way, in the heat spreader HS, the wiring layers (conductor layers) and surroundings (insulator layers) of the vias are formed in a lattice pattern in each of a cross-section direction and a longitudinal section direction.

Figure 13:
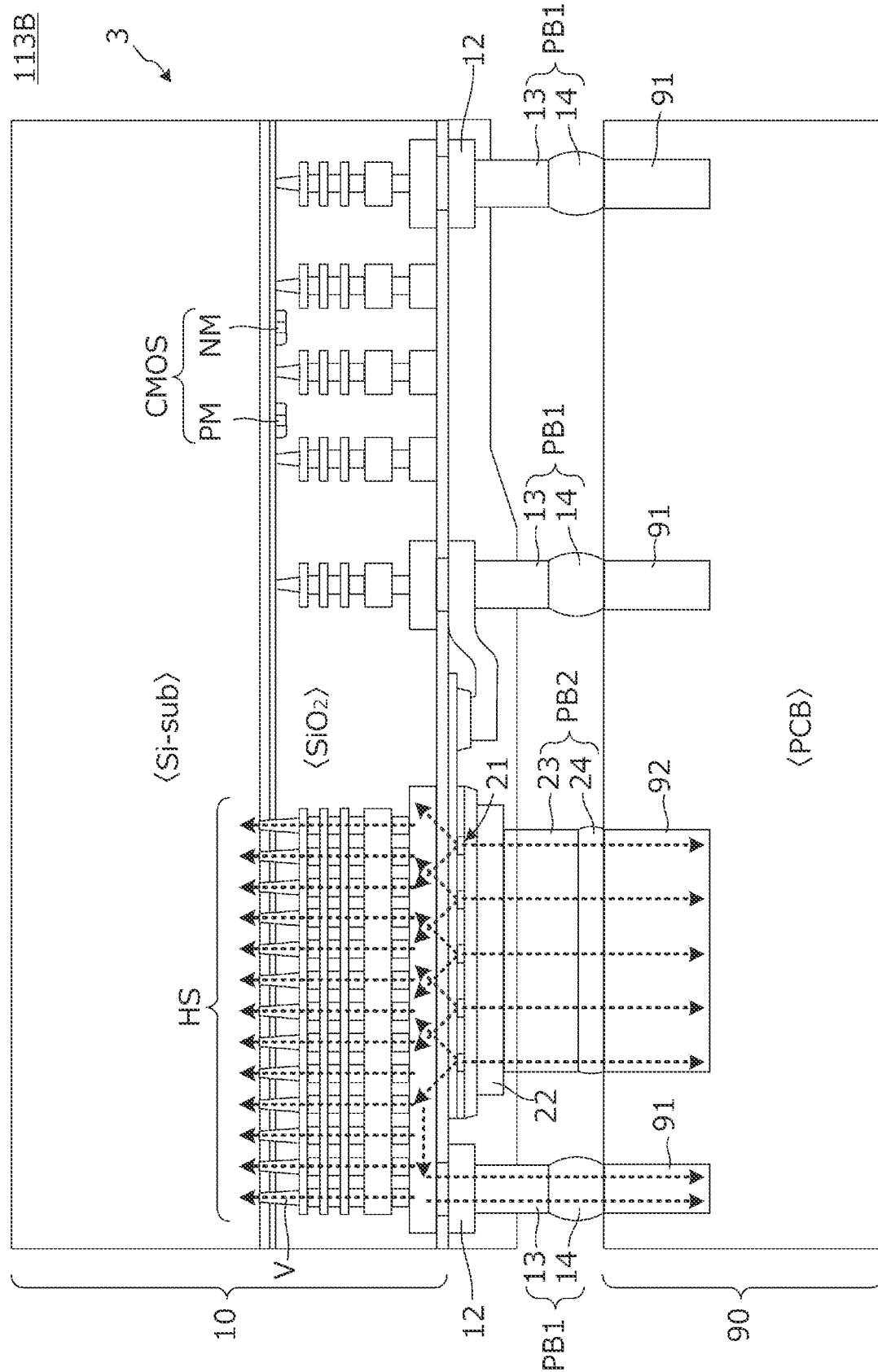
FIG. 13 is a diagram showing heat radiation paths from circuit elements in the RF circuit module.

FIG. 13 is a diagram showing heat radiation paths from the circuit elements 21 in the RF circuit module 113B. In FIG. 13, as represented by the dashed arrows, heat generated by the circuit elements 21 (HBTs) is radiated and exhausted through three heat conduction paths. The first heat conduction path is a path that radiates and exhausts heat from the circuit elements 21 through the second substrate-side electrode 22 and the second conductor pillar bump PB2 to the module substrate-side electrode 92 and the module substrate 90. The second heat conduction path is a path that radiates and exhausts heat generated by the circuit elements 21 to the first substrate 10. The third heat conduction path is a path that radiates and exhausts heat from the circuit elements 21 through the heat spreader HS, the first substrate-side electrodes 12, and the first conductor pillar bumps PB1 to the module substrate-side electrodes 91 and the module substrate 90. Since the heat spreader HS is formed in the first substrate 10, heat in a direction toward the first substrate 10 is radiated and exhausted via the heat spreader HS with high efficiency. Since the third heat conduction path is also formed, heat from the circuit elements 21 is radiated and exhausted with high efficiency.

Figure 14:
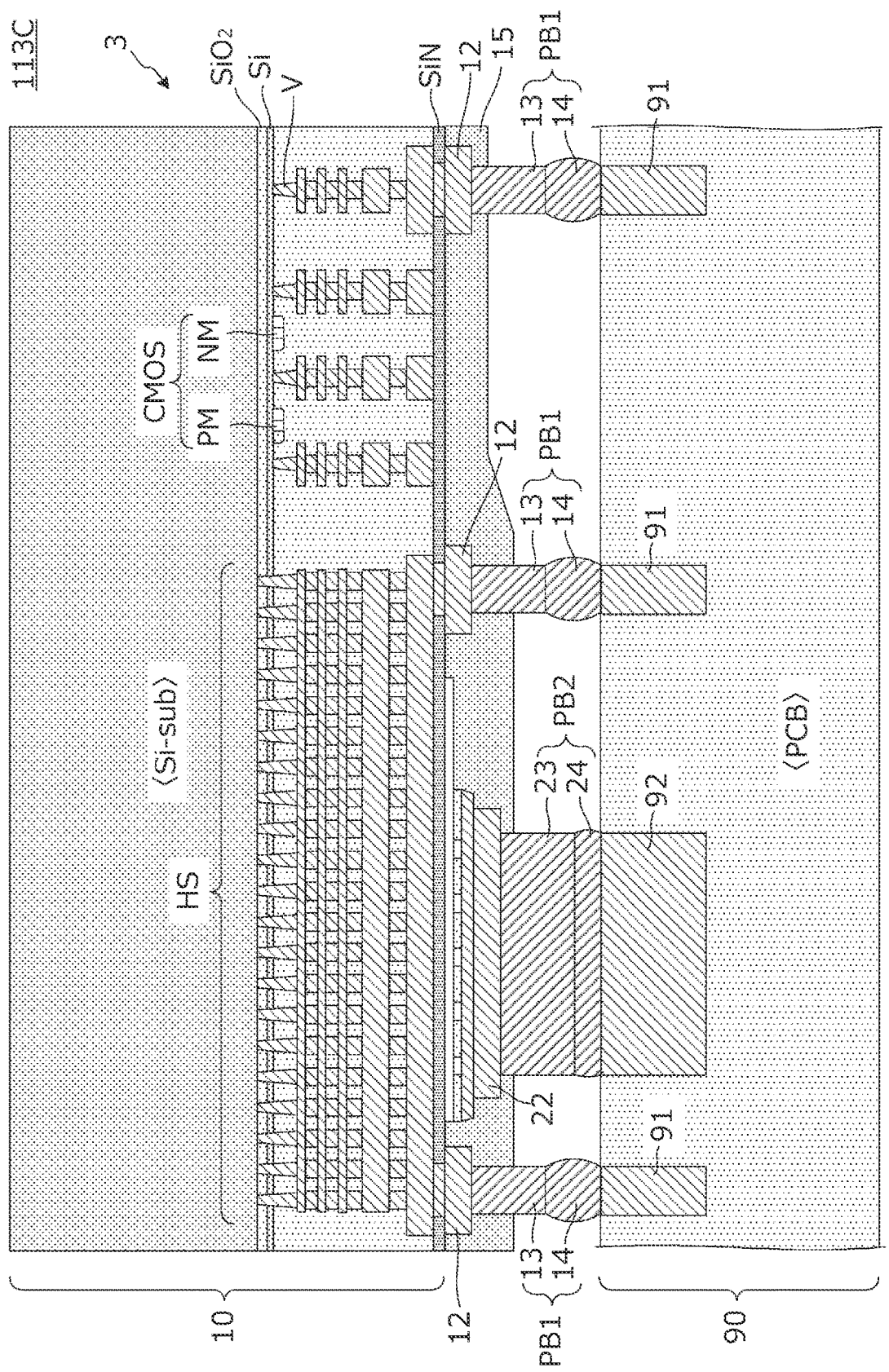
FIG. 14 is a partially cross-sectional view of further another RF circuit module according to the third embodiment.

FIG. 14 is a partially cross-sectional view of further another RF circuit module 113C according to the third embodiment. The RF circuit module 113C differs from the RF circuit module 113B shown in FIG. 11 in that a range in which the heat spreader HS is formed is wide. In the RF circuit module 113C, heat from the circuit elements 21 is efficiently radiated via the heat spreader HS due to the large-sized heat spreader HS. As compared to the example shown in FIG. 13, a plurality of heat conduction paths that radiate and exhaust heat from the circuit elements 21 through the heat spreader HS, the first substrate-side electrodes 12, and the first conductor pillar bumps PB1 to the module substrate-side electrodes 91 and the module substrate 90 is formed, so the effect of radiating heat via the heat conduction paths is also high.

In the thus configured RF circuit modules 113B, 113C, a path for radiating and exhausting heat to the heat spreader HS is added, and a heat conduction path passing through the first substrate-side electrodes 12 and the first conductor pillar bumps PB1 is further added, so the RF circuit module with higher heat radiation property is obtained. Since the vias V of the heat spreader HS reach the Si substrate, heat radiation and exhaust heat efficiency caused by the Si substrate are high.

In the example shown in FIG. 12, the heat spreader HS having a conductor of the wiring layers expanded in a plane is shown. Alternatively, the conductor of the wiring layers may be an independent pattern for each point where the via V provides electrical continuity. With this configuration, an eddy current that flows through the conductor of the wiring layers is suppressed. Alternatively, the conductor of the wiring layers may be in a lattice shape in plan view of the wiring layers. With this configuration as well, an eddy current that flows through the conductor of the wiring layers is suppressed.

Fourth Embodiment

In the fourth embodiment, an RF circuit module in which a first substrate is implemented on a module substrate in a state where a circuit forming surface of the first substrate does not face the module substrate will be illustrated.

Figure 15:
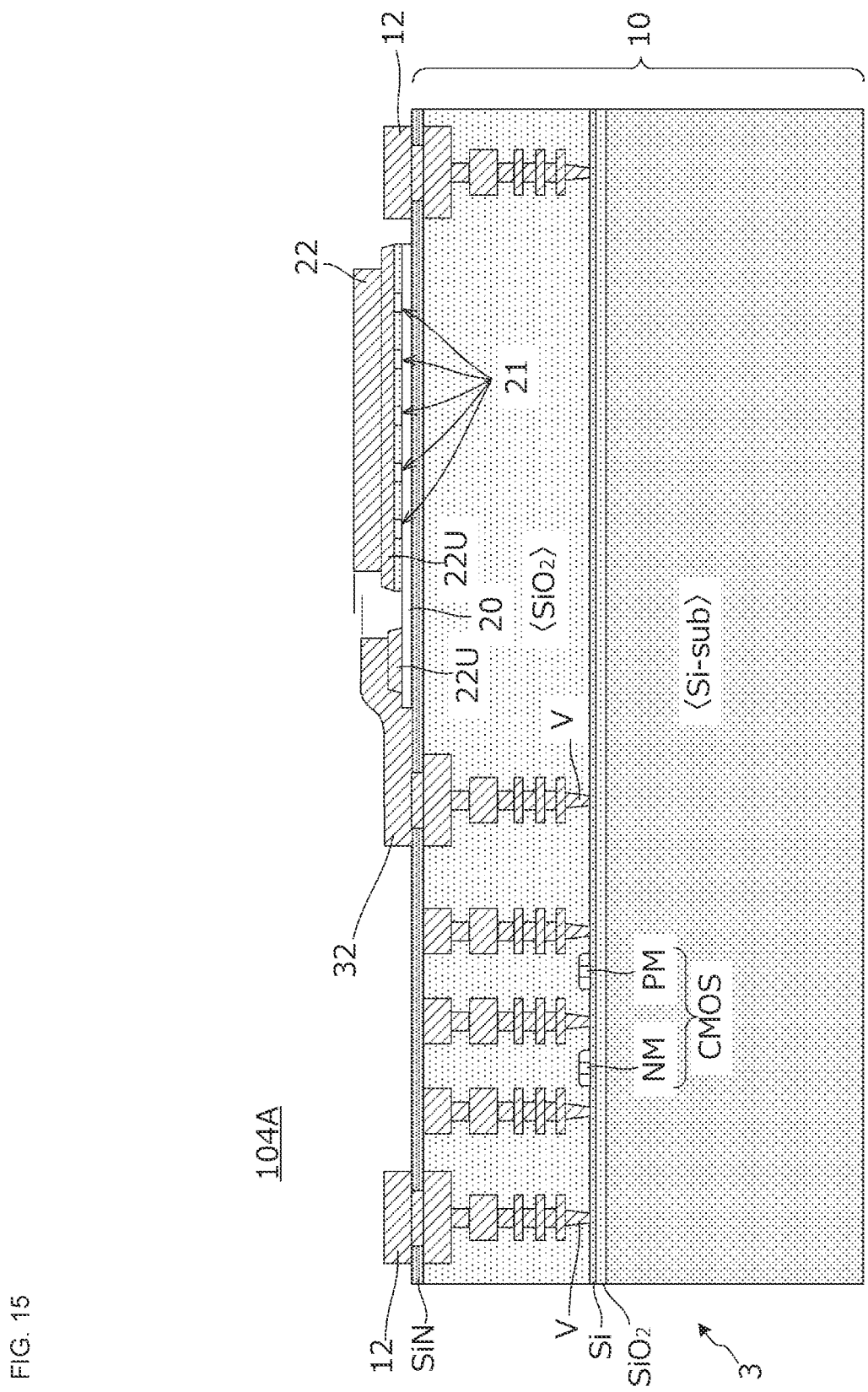
FIG. 15 is a cross-sectional view of a laminated body in an RF circuit module according to a fourth embodiment.

FIG. 15 is a cross-sectional view of a laminated body 104A in an RF circuit module according to the fourth embodiment. A PA circuit element 3 includes a first substrate 10 and a second substrate 20. The laminated body 104A is a laminated body made up of the first substrate 10 and the second substrate 20.

In the first substrate 10, an $SiO_2$ layer as an electrically insulating layer, an Si layer as a device layer, an $SiO_2$ layer as a wire forming layer, and an SiN layer as a passivation layer are formed on an Si substrate Si-sub in this order. First substrate-side electrodes 12, a second substrate-side electrode 22, and a circuit-to-circuit connection wire 32, as a rewiring layer, are formed on the surface of the SiN layer.

During manufacturing, a conductor layer that makes up the circuit-to-circuit connection wire 32, a conductor layer that makes up the second substrate-side electrode 22 (the conductor layer that makes up the second circuit according to preferred embodiments of the present disclosure), and a conductor layer that makes up the first substrate-side electrodes 12 may be made up of the same layer. With this configuration, a manufacturing process is simplified.

A plurality of circuit elements 21 and electrodes used to apply operating voltage or pass operating current to the plurality of circuit elements 21 are formed in the second substrate 20. The second substrate 20 is formed in a separate step as shown in FIG. 5 in the first embodiment, and the circuit elements are formed on the epitaxial layer.

The first substrate-side electrodes 12 and the circuit-to-circuit connection wire 32 are formed at positions that do not overlap the second substrate 20 on the surface of the first substrate 10. The surfaces of the first substrate-side electrodes 12, second substrate-side electrode 22, and circuit-to-circuit connection wire 32 are exposed for external connection.

The configurations of the first substrate 10, the first circuit formed in the first substrate 10, the second substrate 20, and the second circuit formed in the second substrate 20 are the same as those of the example shown in FIG. 8.

In the laminated body 104A, the bottom surface of the first substrate 10 is mounted on a module substrate, the first substrate-side electrodes 12, the second substrate-side electrode 22, or the circuit-to-circuit connection wire 32 is connected to an electrode in the module substrate via a wire.

As represented by narrow extension lines in FIG. 15, in plan view of the module substrate, the top surface of a conductor layer that makes up the circuit-to-circuit connection wire 32 is lower than the top surface of the second substrate-side electrode 22 that is the uppermost portion of the second circuit.

Figure 16:
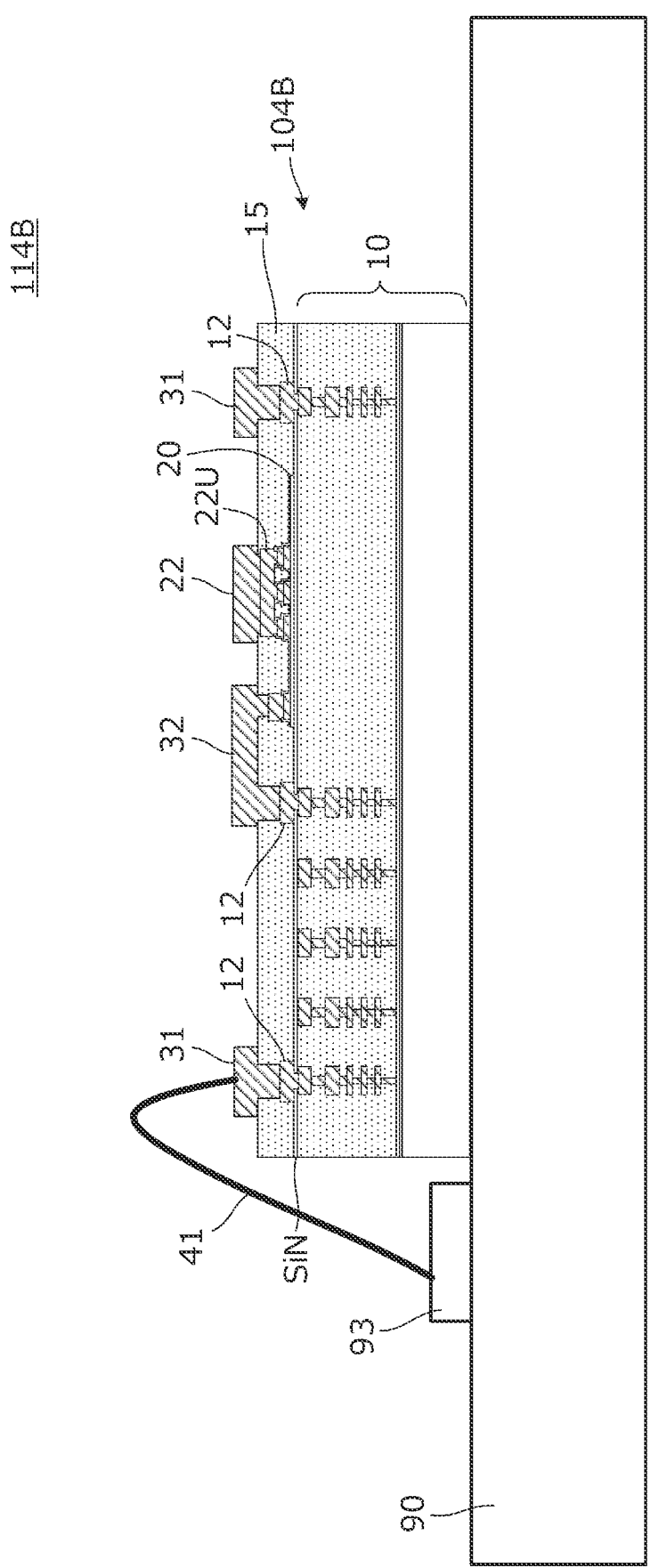
FIG. 16 is a cross-sectional view of another circuit module according to the fourth embodiment.

FIG. 16 is a cross-sectional view of another circuit module 114B according to the fourth embodiment. The circuit module 114B includes a module substrate 90 and a laminated body 104B.

The basic configuration of the laminated body 104B is the same as that of the laminated body 104A shown in FIG. 15. The surface of a first substrate 10 and the surface of a second substrate 20 are coated with a resin layer 15, and the surfaces of external connection electrodes (bonding pads) 31 electrically continuous with first substrate-side electrodes 12, the surface of a second substrate-side electrode 22, and the surface of a circuit-to-circuit connection wire 32 are exposed from the resin layer 15.

The laminated body 104B is mounted on the module substrate 90, and the external connection electrode 31 on the top surface of the laminated body 104B is connected to the module substrate-side electrode 93 via a wire 41.

In the example shown in FIG. 16, in plan view of the module substrate 90, the top surface of a conductor layer that makes up the circuit-to-circuit connection wire 32 is in the same plane as the top surface of the second substrate-side electrode 22 located at the uppermost portion of the second circuit.

In the present embodiment as well, a conductor layer that makes up the external connection electrodes (bonding pads) 31 electrically continuous with the first substrate-side electrodes 12, a conductor layer that makes up the second substrate-side electrode 22, and a conductor layer that makes up the circuit-to-circuit connection wire 32 may be made up of the same layer, and a manufacturing process may be simplified with the conductor layers made up of the same layer.

FIG. 17 is a view showing a manufacturing method for a laminated body of a power amplifier module and the like according to the fourth embodiment. Particularly, a method of forming a circuit-to-circuit connection wire is shown.

The diagrams from step S1 to step S3 in FIG. 17 are cross-sectional views in process of manufacturing a power amplifier module. Manufacturing is actually performed wafer by wafer. FIG. 17 shows a single semiconductor device.

Initially, as shown in step Si in FIG. 17, the first substrate 10 made up of an Si substrate is disposed. When needed, a bonding layer may be formed on the surface of the first substrate 10 made up of the Si substrate with a general semiconductor process. The bonding layer is a metal film, such as an Au film, an organic material film, such as a polyimide (PI) film, a polybenzoxazole (PBO) film, and a benzocyclobutene (BCB) film, or an insulator, such as AlN, SiC, and diamond.

Next, as shown in step S2, the second substrate 20 is bonded onto the first substrate 10. Circuit elements and electrodes are already formed in the second substrate in a separate step.

Subsequently, as shown in step S3, the second substrate-side electrode 22 is formed on the second substrate 20, the first substrate-side electrode 12 is formed on the first substrate 10, and the circuit-to-circuit connection wire 32 is formed from the second substrate 20 to the first substrate 10 by means of a general semiconductor process. The circuit-to-circuit connection wire 32 connects the first circuit formed in the first substrate and the second circuit formed in the second substrate 20.

The first substrate-side electrode 12, the second substrate-side electrode 22, and the circuit-to-circuit connection wire 32 can be formed at the same time in one process.

Figure 18:
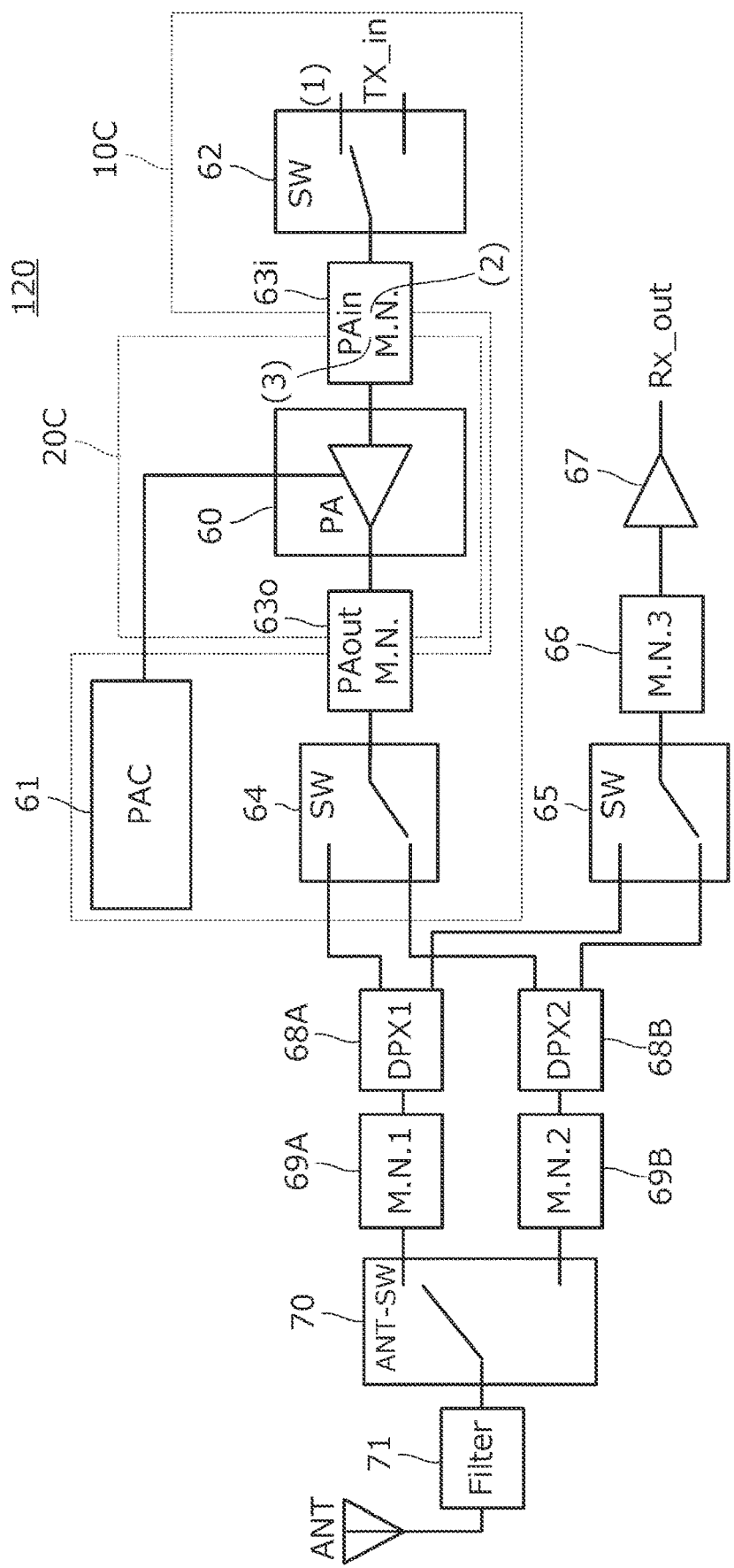
FIG. 18 is a block diagram showing the circuit configuration of a front-end module according to the fourth embodiment.

FIG. 18 is a block diagram showing the circuit configuration of a front-end module 120 according to the fourth embodiment. The front-end module 120 includes a band pass filter 71 connected to an antenna ANT, an antenna switch 70, impedance matching circuits 69A, 69B, duplexers 68A, 68B, switch 64, 65, an impedance matching circuit 66, a low noise amplifier 67, a switch 62, a radio-frequency amplifier 60, a radio-frequency amplifier control circuit 61, impedance matching circuits 63$i$, 63$o$, and a switch 64.

The switch 62 and the radio-frequency amplifier control circuit 61 are formed in a first circuit 10C of the first substrate 10. The radio-frequency amplifier 60 is formed in a second circuit 20C of the second substrate 20. The impedance matching circuit 63$o$ is formed in the first circuit 10C, the second circuit 20C, or both. The impedance matching circuit 63$i$ is also formed in the first circuit 10C, the second circuit 20C, or both. Each of the impedance matching circuits 63$i$, 63$o$ is made up of, for example, an inductance and a capacitance that are generated in a conductor portion that connects the first circuit 10C and the second circuit 20C.

The basic configuration of the front-end module 120 shown in FIG. 18 is the same as that of the front-end module 120 shown in FIG. 7. In FIG. 18, when an input portion of a transmission signal to the switch 62 is indicated by (1), an output portion of a transmission signal from the first circuit 10C is indicated by (2), and an input portion of a transmission signal to the second circuit 20C is indicated by (3), the path of (2) and the path of (3) are remarkably close to each other.

Figure 26:
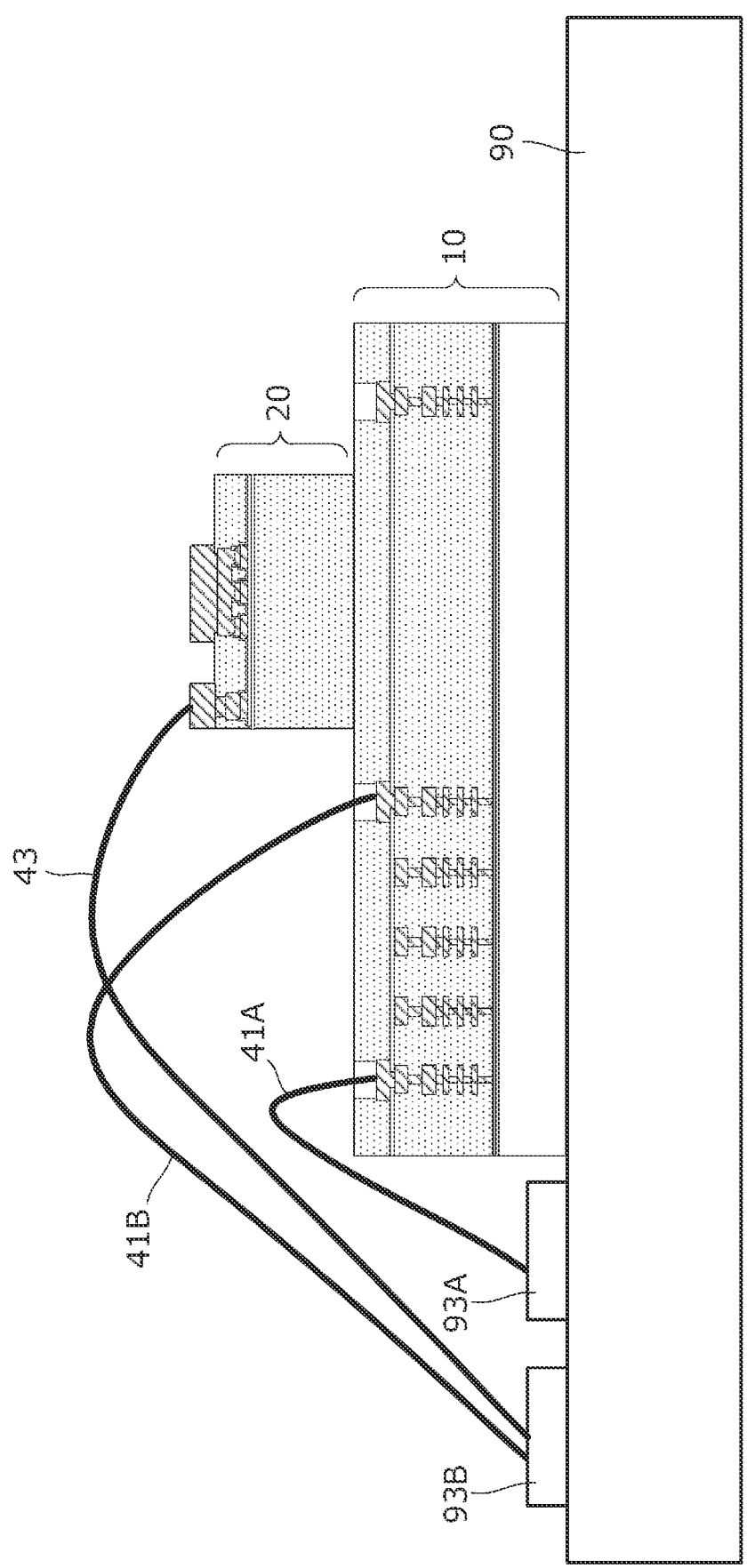
FIG. 26 is a diagram showing the configuration of an RF circuit module as a comparative example to the RF circuit module according to the fourth embodiment.
Figure 27:
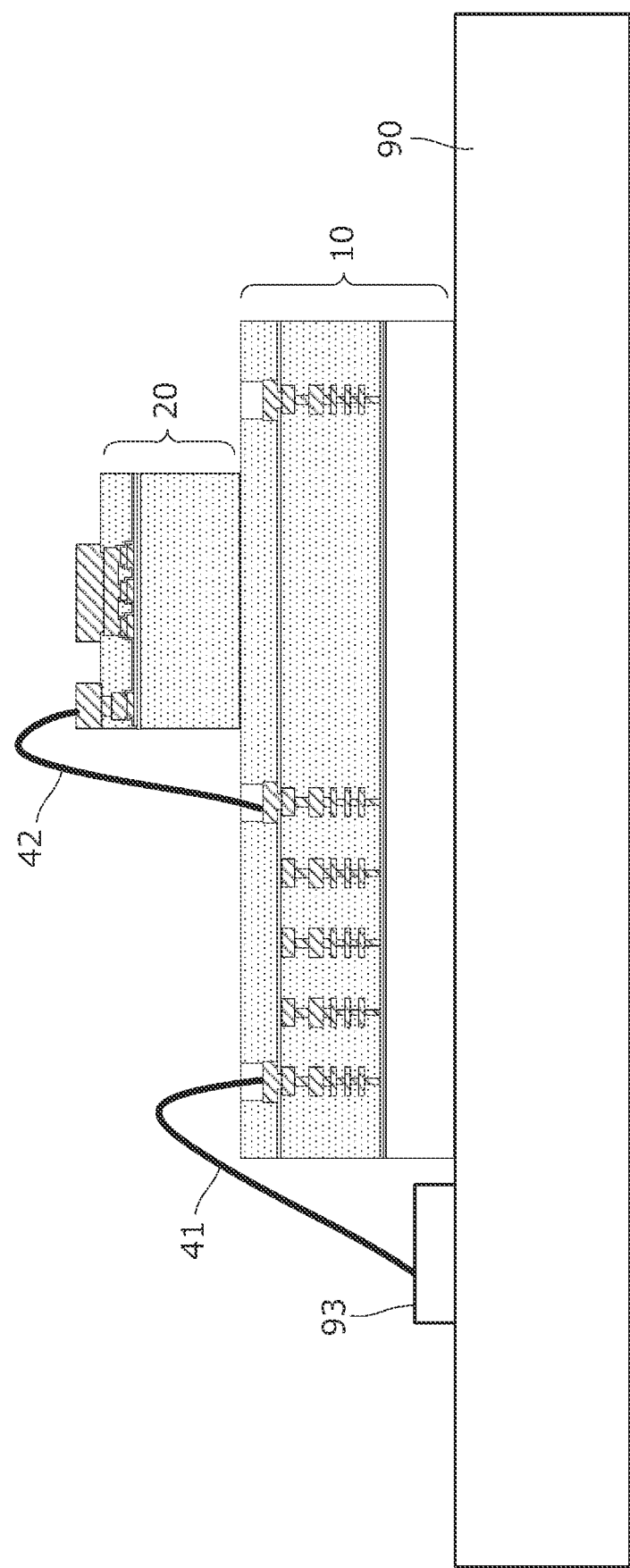
FIG. 27 is a diagram showing the configuration of an RF circuit module as another comparative example to the RF circuit module according to the fourth embodiment.

Here, FIG. 26 and FIG. 27 show cross-sectional views of RF circuit modules as comparative examples. In any of the examples shown in FIG. 26 and FIG. 27, a first substrate 10 in which a first circuit is formed is mounted on a module substrate 90, and a second substrate 20 in which a second circuit is formed is mounted on the first substrate 10.

In the example shown in FIG. 26, a module substrate-side electrode 93A and part of the first circuit are connected via a wire 41A, a module substrate-side electrode 93B and part of the first circuit are connected via a wire 41B, and the module substrate-side electrode 93B and part of the second circuit are connected via a wire 43.

In the example shown in FIG. 27, a module substrate-side electrode 93 and part of the first circuit are connected via a wire 41, and part of the first circuit and part of the second circuit are connected via a wire 42.

In the structure as shown in FIG. 26, part of the first circuit and part of the second circuit are connected via the wires 41B, 43, and this connection path is a path between (2) and (3), shown in FIG. 18, so a parasitic inductance and a parasitic capacitance caused by the wires 41B, 43 are large. Therefore, a signal loss is large, and predetermined characteristics of the impedance matching circuit 63$i$ are not obtained.

In the structure as shown in FIG. 27, part of the first circuit and part of the second circuit are connected via the wire 42, and this connection path is a path between (2) and (3), shown in FIG. 18, so there is the influence of a parasitic inductance and a parasitic capacitance caused by the wire 42. Therefore, there is a signal loss although the signal loss is improved as compared to the structure shown in FIG. 26, and predetermined characteristics of the impedance matching circuit 63$i$ are not obtained.

In contrast, in the RF circuit module of the present embodiment, shown in FIG. 15, FIG. 16, and FIG. 17, the path between (2) and (3), shown in FIG. 18, is made up of the circuit-to-circuit connection wire 32. A parasitic inductance and a parasitic capacitance that occur in the circuit-to-circuit connection wire 32 are small. Therefore, a signal loss is small, and predetermined characteristics of the impedance matching circuit 63$i$ are obtained.

Fifth Embodiment

In the fifth embodiment, an RF circuit module having through conductors in a first substrate 10 will be illustrated.

Figure 19:
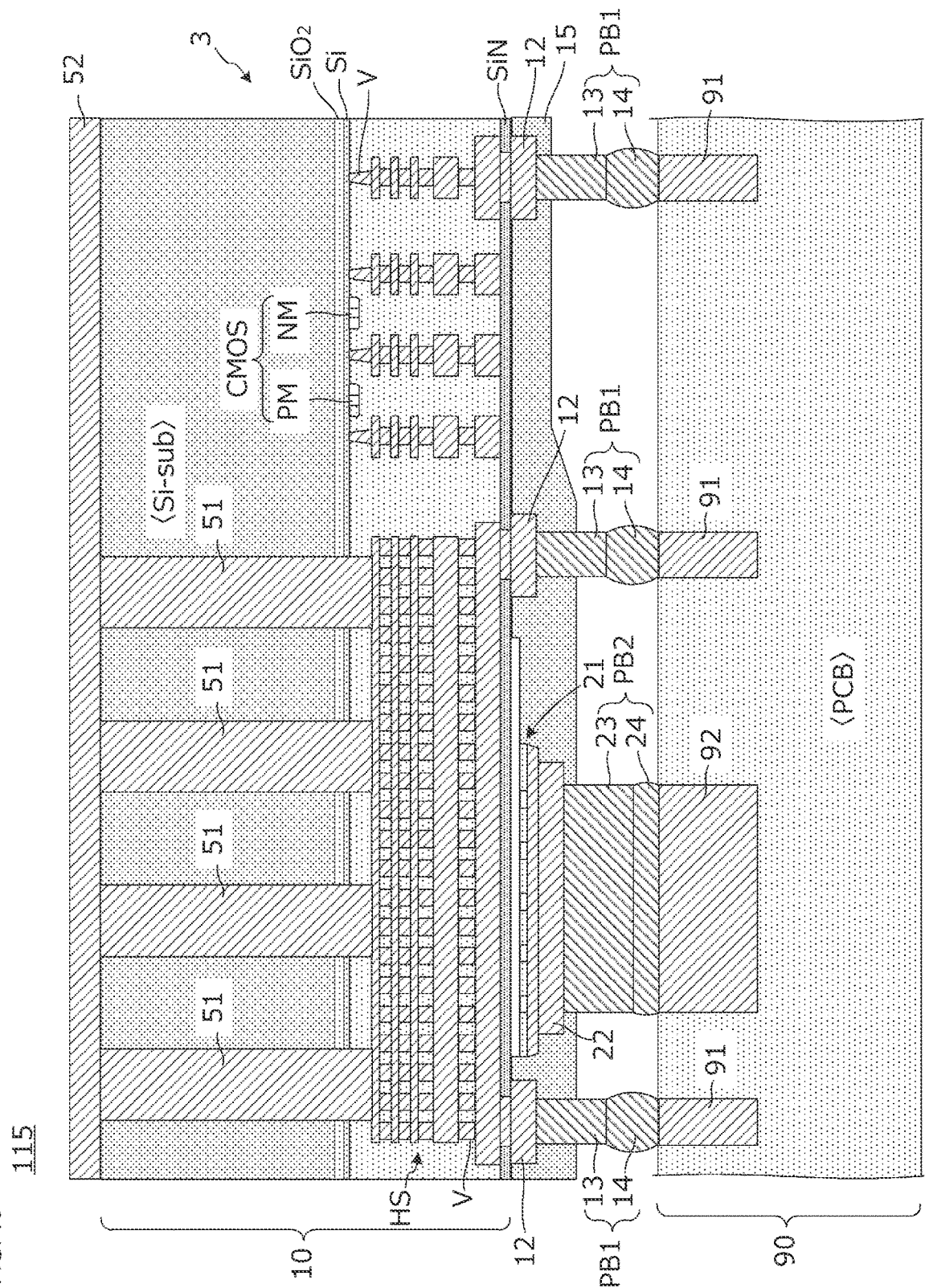
FIG. 19 is a cross-sectional view of an RF circuit module according to a fifth embodiment.

FIG. 19 is a cross-sectional view of an RF circuit module 115 according to the fifth embodiment. In the RF circuit module 115, wires such as vias V that extend a circuit formed in an Si layer as a device layer, to first substrate-side electrodes 12 are formed in an $SiO_2$ layer as a wire forming layer. A heat spreader HS is formed near circuit elements 21 that are HBTs. The heat spreader HS is made up of a plurality of wiring layers made of Cu or Al and vias V made of Cu or Al connecting the wiring layers. A surface conductor 52 is formed on the top surface of the first substrate 10, and a plurality of through conductors 51 is formed between the surface conductor 52 and the heat spreader HS.

When the first substrate 10 is Si, the through conductors 51 are made of, for example, W (tungsten) or Cu. When the first substrate 10 is GaAs, the through conductors 51 may be made of, for example, Au.

According to the present embodiment, heat emitted from the circuit elements 21 that are HBTs can be radiated or exhausted with high efficiency through the heat spreader HS, the through conductors 51, and the surface conductor 52 to the outside.

Sixth Embodiment

In the sixth embodiment, an RF circuit module in which the structure of connecting a first circuit and a second circuit and the structure of connecting the first circuit and the second circuit to a module substrate are different from those in the examples described above will be described.

Figure 20:
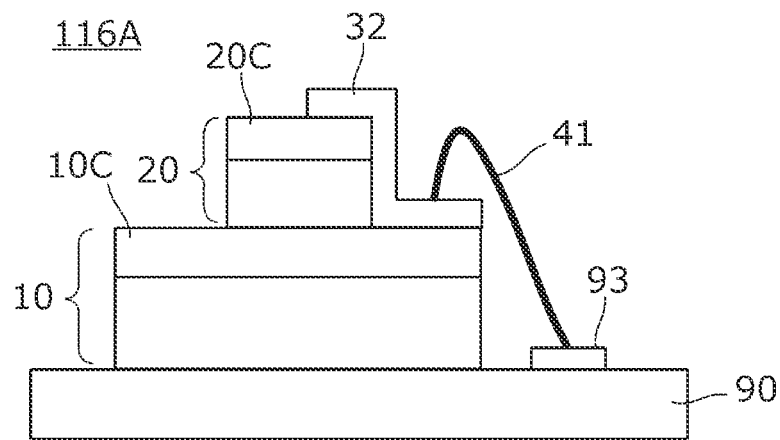
FIG. 20 is a schematic front view of an RF circuit module according to a sixth embodiment.

FIG. 20 is a schematic front view of an RF circuit module 116A according to the sixth embodiment. A first circuit 10C is formed at the surface of a first substrate 10, and a second circuit 20C is formed at the surface of a second substrate 20.

A module substrate-side electrode 93 that is an electrode for connecting a component is formed on a module substrate 90.

The first circuit 10C or the second circuit 20C includes a radio-frequency amplifier circuit that amplifies a radio-frequency signal. The circuit different from the circuit in which the radio-frequency amplifier circuit is implemented includes a control circuit that controls the operation of the radio-frequency amplifier circuit. For example, the second circuit 20C includes the radio-frequency amplifier, and the first circuit 10C includes the control circuit. The radio-frequency amplifier circuit corresponds to, for example, the radio-frequency amplifier 60 shown in FIG. 18. The control circuit corresponds to, for example, the radio-frequency amplifier control circuit 61 shown in FIG. 18.

The second substrate 20 and the first substrate 10 overlap such that one of the first substrate 10 and the second substrate 20 is included in the other one of the first substrate 10 and the second substrate 20 in plan view of the module substrate 90. In the example shown in FIG. 20, the second substrate 20 overlaps the first substrate 10 such that the second substrate 20 is included in the first substrate 10.

A conductor layer that makes up a circuit-to-circuit connection wire 32 that electrically connects the first circuit 10C and the second circuit 20C is formed from the second substrate 20 in which the second circuit 20C is formed to the first substrate 10 in which the first circuit 10C is formed. In other words, the first substrate 10 and the second substrate 20 have a conductor layer that makes up the circuit-to-circuit connection wire 32 that electrically connects the first circuit 10C and the second circuit 20C without intervening the module substrate 90.

The conductor layer that makes up the circuit-to-circuit connection wire 32 is made from the same layer as the conductor layer that makes up the first circuit 10C or the second circuit 20C. In other words, part of the conductor layer that makes up the circuit-to-circuit connection wire 32 is in the same layer as the conductor layer that makes up the first circuit 10C, and part of the conductor layer that makes up the circuit-to-circuit connection wire 32 is in the same layer as the conductor layer that makes up the second circuit 12C.

With this structure, part of the first circuit 10C and part of the second circuit 20C are electrically continuous with each other, and the electrically continuous portion is electrically continuous with the module substrate-side electrode 93 via the wire 41/

Figure 21:
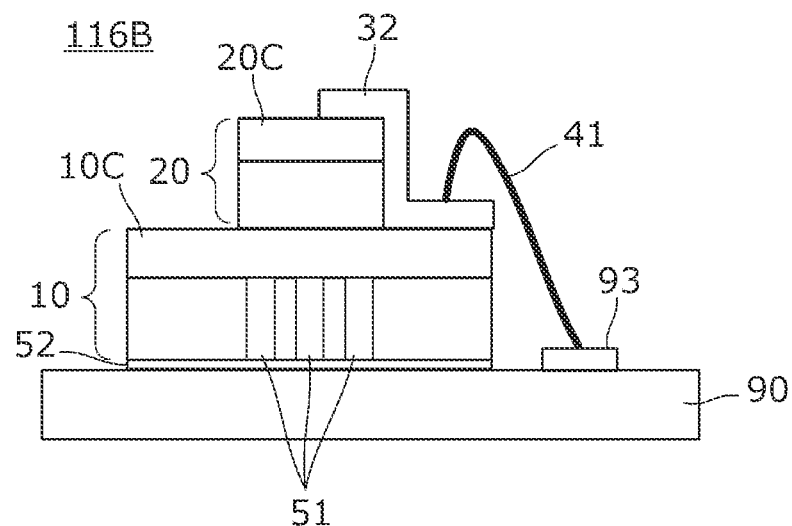
FIG. 21 is a front view of another RF circuit module according to the sixth embodiment.

FIG. 21 is a front view of another RF circuit module 116B according to the sixth embodiment. A first circuit 10C is formed at the surface of a first substrate 10, and a second circuit 20C is formed at the surface of a second substrate 20.

In the RF circuit module 116B, a surface conductor 52 is formed at the under surface of the first substrate 10, and a plurality of through conductors 51 is formed between the surface conductor 52 and the first circuit 10C. The other configuration is similar to that of the RF circuit module 116A. With the RF circuit module 116B, heat emitted from the first circuit 10C can be radiated and exhausted with high efficiency through the through conductors 51 and the surface conductor 52 to the outside.

Seventh Embodiment

In the seventh embodiment, an RF circuit module in which a first substrate and a second substrate are mounted on a module substrate in a state where a first circuit and a second circuit face the module substrate will be illustrated.

Figure 22:
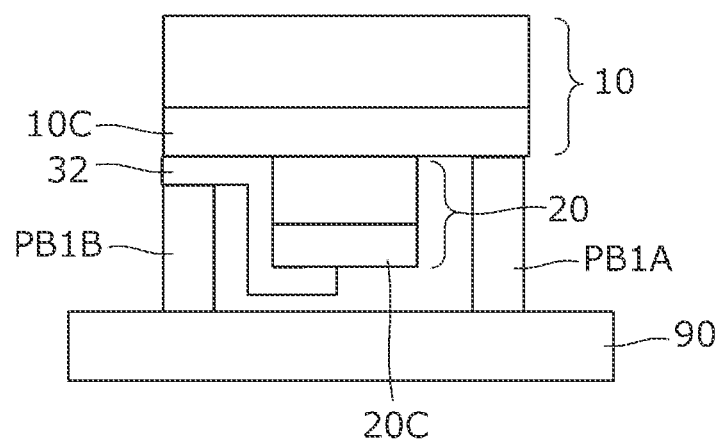
FIG. 22 is a front view of an RF circuit module according to a seventh embodiment.

FIG. 22 is a front view of an RF circuit module 117A according to the seventh embodiment. A first circuit 10C is formed at the surface of a first substrate 10, and a second circuit 20C is formed at the surface of a second substrate 20.

The first circuit 10C of the first substrate 10 and the second circuit 20C of the second substrate 20 face an electrode forming surface of the module substrate 90.

The first substrate 10 has conductor pillar bumps PB1A, PB1B connected to the electrodes of the module substrate 90. The conductor pillar bump PB1B is directly in contact with a conductor layer that makes up a circuit-to-circuit connection wire 32. The conductor pillar bumps PB1A, PB1B each correspond to the conductor protrusion according to preferred embodiments of the present disclosure. With this structure, the path connecting part of the first circuit 10C and part of the second circuit 20C is shortened, and the path connecting these first circuit 10C and second circuit 20C to the electrodes of the module substrate 90 is also shortened. Therefore, as compared to the existing structure for connection using a wire, the connection paths have a low impedance and a low inductance.

The first circuit 10C or the second circuit 20C includes a radio-frequency amplifier circuit that amplifies a radio-frequency signal. The circuit different from the circuit in which the radio-frequency amplifier circuit is implemented includes a control circuit that controls the operation of the radio-frequency amplifier circuit. For example, the second circuit 20C includes the radio-frequency amplifier, and the first circuit 10C includes the control circuit. The radio-frequency amplifier circuit corresponds to, for example, the radio-frequency amplifier 60 shown in FIG. 18. The control circuit corresponds to, for example, the radio-frequency amplifier control circuit 61 shown in FIG. 18.

The second substrate 20 and the first substrate 10 overlap such that one of the first substrate 10 and the second substrate 20 is included in the other one of the first substrate 10 and the second substrate 20 in plan view of the module substrate 90. In the example shown in FIG. 22, the second substrate 20 overlaps the first substrate 10 such that the second substrate 20 is included in the first substrate 10.

A conductor layer that makes up a circuit-to-circuit connection wire 32 that electrically connects the first circuit 10C and the second circuit 20C is formed from the second substrate 20 in which the second circuit 20C is formed to the first substrate 10 in which the first circuit 10C is formed.

With this structure, part of the first circuit 10C and part of the second circuit 20C are electrically continuous with each other via the circuit-to-circuit connection wire 32, and part of the first circuit 10C and part of the second circuit 20C are electrically continuous with the electrodes of the module substrate 90 via the conductor pillar bumps PB1.

Figure 23:
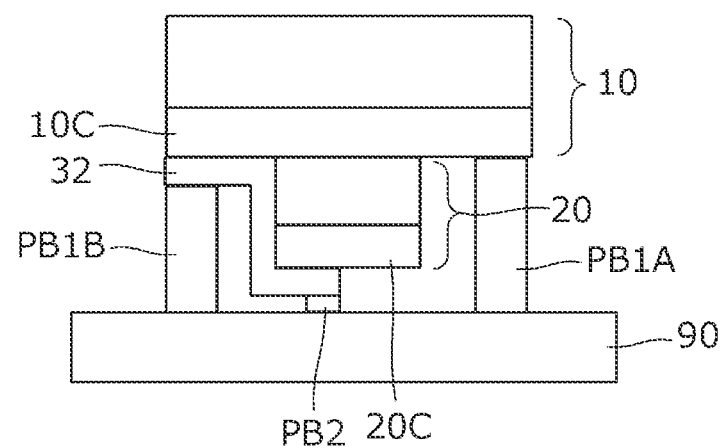
FIG. 23 is a front view of another RF circuit module according to the seventh embodiment.

FIG. 23 is a front view of another RF circuit module 117B according to the seventh embodiment. A first circuit 10C is formed at the surface of a first substrate 10, and a second circuit 20C is formed at the surface of a second substrate 20.

The first circuit 10C of the first substrate 10 and the second circuit 20C of the second substrate 20 face an electrode forming surface of the module substrate 90. The first substrate 10 has conductor pillar bumps PB1A, PB1B connected to the electrodes of the module substrate 90. The second substrate 20 has a conductor pillar bump PB2 connected to the electrode of the module substrate 90.

The conductor pillar bump PB2 is directly in contact with a conductor layer that makes up a circuit-to-circuit connection wire 32. With this structure, the path connecting part of the first circuit 10C and part of the second circuit 20C is shortened, and the path connecting these first circuit 10C and second circuit 20C to the electrodes of the module substrate 90 is also shortened. Particularly, the path connecting the second circuit 20C and the electrode formed in the module substrate 90 is further shortened. Therefore, as compared to the existing structure for connection using a wire, the connection paths have a low impedance and a low inductance.

Lastly, the description of the above-described embodiments is illustrative in all respects and is not restrictive. Modifications or alterations are possible as needed by persons skilled in the art. The scope of the present disclosure is described not by the above-described embodiments but by the appended claims. The scope of the present disclosure encompasses modifications from the embodiments within the range equivalent to the appended claims.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A manufacturing method for an RF circuit module including a module substrate having electrodes for mounting components, a first substrate in which a first circuit including a control circuit is implemented, and a second substrate in which a second circuit including a radio-frequency amplifier circuit controlled by the control circuit is implemented, the manufacturing method comprising:
   forming the first circuit and a substrate-to-substrate connection conductor in an elemental semiconductor substrate that is the first substrate;
   forming a semiconductor thin film on a compound semiconductor substrate via a release layer, the semiconductor thin film having the second circuit and a substrate-to-substrate connection conductor, the semiconductor thin film being the second substrate;
   implementing the second substrate by removing the release layer through etching to release the semiconductor thin film from the compound semiconductor substrate;
   implementing a laminated body made up of the first substrate and the second substrate by bonding the second substrate at a predetermined position of the first substrate to connect the substrate-to-substrate connection conductor of the first substrate and the substrate-to-substrate connection conductor of the second substrate;
   forming a first substrate-side conductor protrusion connected to the first circuit and a second substrate-side conductor protrusion connected to the second circuit; and
   mounting the laminated body on the module substrate by connecting the first substrate-side conductor protrusion and the second substrate-side conductor protrusion to the electrodes of the module substrate.

2. A manufacturing method for an RF circuit module including a module substrate having electrodes for mounting components, a first substrate in which a first circuit including a control circuit is implemented, and a second substrate in which a second circuit including a radio-frequency amplifier circuit controlled by the control circuit is implemented, the manufacturing method comprising:
   forming the first circuit in an elemental semiconductor substrate that is the first substrate;
   forming a semiconductor thin film on a compound semiconductor substrate via a release layer, the semiconductor thin film having the second circuit, the semiconductor thin film being the second substrate;
   implementing the second substrate by removing the release layer through etching to release the semiconductor thin film from the compound semiconductor substrate;
   providing a laminated body made up of the first substrate and the second substrate by bonding the second substrate at a predetermined position of the first substrate;
   forming a substrate-to-substrate connection conductor that connects the first circuit and the second circuit; and
   mounting the laminated body on the module substrate.

* * * * *